US009326377B2

(12) United States Patent
Morita et al.

(10) Patent No.: US 9,326,377 B2
(45) Date of Patent: Apr. 26, 2016

(54) PRINTED WIRING BOARD

(71) Applicant: IBIDEN Co., Ltd., Ogaki (JP)

(72) Inventors: Haruhiko Morita, Ogaki (JP); Shinobu Kato, Ogaki (JP); Yasuhiko Mano, Ogaki (JP); Satoshi Kurokawa, Gifu (JP)

(73) Assignee: IBIDEN Co., Ltd., Ogaki (JP)

( * ) Notice: Subject to any disclaimer, the term of this patent is extended or adjusted under 35 U.S.C. 154(b) by 263 days.

(21) Appl. No.: 13/953,150

(22) Filed: Jul. 29, 2013

(65) Prior Publication Data

US 2014/0027165 A1    Jan. 30, 2014

(30) Foreign Application Priority Data

Jul. 30, 2012   (JP) ................................ 2012-168485

(51) Int. Cl.
| | |
|---|---|
| H05K 1/00 | (2006.01) |
| H05K 1/03 | (2006.01) |
| H05K 1/16 | (2006.01) |
| H05K 1/11 | (2006.01) |
| H05K 3/46 | (2006.01) |
| H05K 1/02 | (2006.01) |

(52) U.S. Cl.
CPC .............. *H05K 1/0306* (2013.01); *H05K 1/024* (2013.01); *H05K 3/4673* (2013.01); *H05K 1/0219* (2013.01); *H05K 2201/0191* (2013.01)

(58) Field of Classification Search
CPC ................. H05K 1/0306; H05K 1/024; H05K 2201/0191
USPC .................................... 174/256, 258, 260, 262
See application file for complete search history.

(56) References Cited

U.S. PATENT DOCUMENTS

| | | | | |
|---|---|---|---|---|
| 2009/0236128 | A1* | 9/2009 | Tsukada et al. ................ | 174/256 |
| 2010/0300737 | A1* | 12/2010 | Sato et al. ...................... | 174/260 |
| 2011/0073358 | A1* | 3/2011 | Hayashi ......................... | 174/258 |
| 2011/0240351 | A1* | 10/2011 | Wakita et al. .................. | 174/258 |
| 2012/0085572 | A1* | 4/2012 | Sakai ............................. | 174/258 |
| 2013/0146345 | A1 | 6/2013 | Kajihara et al. | |

FOREIGN PATENT DOCUMENTS

JP          2001-119111 A       4/2001

* cited by examiner

*Primary Examiner* — Sherman Ng
(74) *Attorney, Agent, or Firm* — Oblon, McClelland, Maier & Neustadt, L.L.P.

(57) ABSTRACT

A printed wiring board includes a first buildup layer including first and second interlayer insulating layers, and a second buildup layer formed on the first buildup layer and including the outermost interlayer insulating layer and the outermost conductive layer formed on the outermost interlayer resin insulating layer. The buildup layer includes a first signal line interposed between the first and second interlayer insulating layers, a first ground layer formed on a surface of the first interlayer resin insulating layer, and a second ground layer formed on a surface of the second interlayer resin insulating layer such that the first signal line is interposed between the first and second ground layers, the first and second interlayer insulating layers and the outermost interlayer insulating layer include resin materials, respectively, and the first and second interlayer insulating layers are different from the outermost interlayer insulating layer in material and/or thickness.

20 Claims, 30 Drawing Sheets

(A)

(B)

(A)

(B)

(A)

(B)

(A)

(B)

(A)

BOTTOM OF HIGH-SPEED SIGNAL VIA CONDUCTOR OF FIRST INTERLAYER
RESIN INSULATING LAYER (B)

END OF OPENING OF SOLDER
RESIST LAYER (A)

(B)

(C)

(A)

(B)

(A)

(B)

(C)

(D)

(E)

(F)

(A)

LAND OF HIGH-SPEED SIGNAL VIA CONDUCTOR OF FIRST INTERLAYER RESIN INSULATING LAYER (B)

LAND OF HIGH-SPEED SIGNAL VIA CONDUCTOR OF FIRST INTERLAYER RESIN INSULATING LAYER

PRINTED WIRING BOARD

CROSS-REFERENCE TO RELATED APPLICATIONS

The present application is based upon and claims the benefit of priority to Japanese Patent Application No. 2012-168485, filed Jul. 30, 2012, the entire contents of which are incorporated herein by reference.

BACKGROUND OF THE INVENTION

1. Field of the Invention

The present invention relates to a printed wiring board having first and second buildup layers.

2. Description of Background Art

JP 2001-119111 A describes a stripline and a micro-stripline. FIG. 1 of JP 2001-119111 A illustrates the micro-stripline. In the drawing, two insulating layers are interposed between the micro-stripline and a ground layer. The two insulating layers are a low-permittivity resin layer immediately under the micro-stripline and a general base material immediately above the ground line. JP 2001-119111 A described a stripline in its FIG. 4, and a general base material is formed between the stripline and the ground layer. The entire contents of this publication are incorporated herein by reference.

SUMMARY OF THE INVENTION

According to one aspect of the present invention, a printed wiring board includes a first buildup layer including a first interlayer insulating layer and a second interlayer insulating layer, and a second buildup layer formed on the first buildup layer and including the outermost interlayer insulating layer and the outermost conductive layer formed on the outermost interlayer resin insulating layer. The buildup layer includes a first signal line interposed between the first interlayer insulating layer and the second interlayer insulating layer, a first ground layer formed on a surface of the first interlayer resin insulating layer, and a second ground layer formed on a surface of the second interlayer resin insulating layer such that the first signal line is interposed between the first ground layer and the second ground layer, the first and second interlayer insulating layers in the first buildup layer and the outermost interlayer insulating layer in the second buildup layer include resin materials, respectively, and the first and second interlayer insulating layers in the first buildup layer are different in material, thickness or a combination thereof from the outermost interlayer insulating layer in the second buildup layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
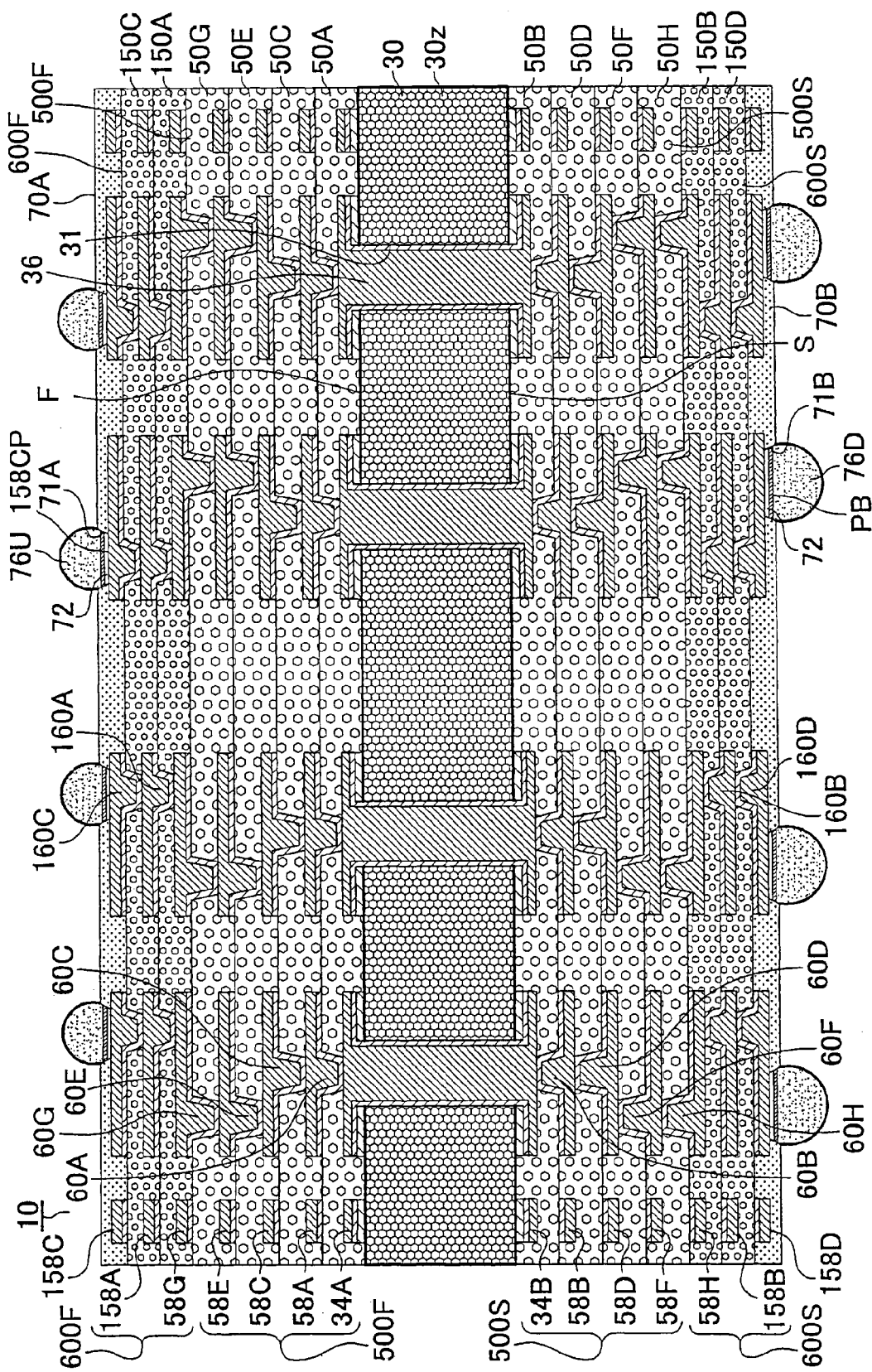
FIG. 1 is a cross-sectional view of a printed wiring board according to a first embodiment of the invention.

The embodiments will now be described with reference to the accompanying drawings, wherein like reference numerals designate corresponding or identical elements throughout the various drawings.

First Embodiment

FIG. 1 illustrates a cross section of a printed wiring board 10 according to a first embodiment of the invention. Printed wiring board 10 has a core substrate 30. Core substrate 30 includes an insulating base (30z) having a first surface (F) and a second surface (S) opposite the first surface, a conductive layer (34A) of the first surface of the insulating base, a conductive layer (34B) of the second surface of the insulating base, and a through-hole conductor 36 connecting conductive layer (34A) to conductive layer (34B). Through-hole conductor 36 is formed by filling the inside of a through hole 31 formed in the insulating base with plating film. Conductive layer (34A) includes a ground layer, and the ground layer includes a fourth ground layer.

The first surface of the core substrate and the first surface of the insulating base are the same surface, and the second surface of the core substrate and the second surface of the insulating base (an insulating substrate) are the same surface. A first buildup layer (500F) is formed on first surface (F) of core substrate 30. First buildup layer (500F) has four interlayer resin insulating layers (50A, 50C, 50E, 50G) formed on first surface (F) of core substrate 30. The interlayer resin insulating layer closest to the core substrate is fourth interlayer resin insulating layer (50A). Third interlayer resin insulating layer (50C), second interlayer resin insulating layer (50E), and first interlayer resin insulating layer (50G) are sequentially laminated on the fourth interlayer resin insulating layer.

A conductive layer (58A) is formed on fourth interlayer resin insulating layer (50A). Conductive layer (58A) has a second signal line (58AH).

Third interlayer resin insulating layer (50C) is formed on fourth interlayer resin insulating layer (50A) and conductive layer (58A).

A conductive layer (58C) is formed on third interlayer resin insulating layer (50C). Conductive layer (58C) includes at least one of the second ground layer and the third ground layer. The second signal line is interposed between the fourth ground layer and the second or third ground layer, and a stripline is formed.

Second interlayer resin insulating layer (50E) is formed on third interlayer resin insulating layer (50C) and conductive layer (58C).

A conductive layer (58E) is formed on second interlayer resin insulating layer (50E). Conductive layer (58E) includes a first signal line (58EH). Conductive layer (58E) may further include a third signal line (58EL).

First interlayer resin insulating layer (50G) is formed on second interlayer resin insulating layer (50E) and conductive layer (58E). A conductive layer (58G) is formed on first interlayer resin insulating layer (50G).

Conductive layer (58G) includes a first ground layer. The first signal line is interposed between the first ground layer and the second or third ground layer, and a stripline is formed.

The second ground layer and the third ground layer may be connected.

The first buildup layer includes conductive layer (58G), conductive layer (58E), conductive layer (58C) and conductive layer (58A).

Conductive layers (34A, 58A, 58C, 58E, 58G) of different layers are connected by via conductors (60A, 60C, 60E, 60G) passing through the interlayer resin insulating layer. High-frequency signals are transmitted through the first and second signal lines, and a low-frequency signal is transmitted through the third signal line. A high-frequency signal is, for example, a signal of 6.0 GHz or higher.

A second buildup layer (600F) is formed on first buildup layer (500F). Second buildup layer (600F) includes an uppermost interlayer resin insulating layer (150C), and an uppermost conductive layer (158C) on uppermost interlayer resin insulating layer (150C). In addition, the second buildup layer includes an upper interlayer resin insulating layer (150A) between the uppermost interlayer resin insulating layer and the first buildup layer, and an upper conductive layer (158A) on the upper interlayer resin insulating layer.

Thicknesses of conductive layers (158A, 158C) belonging to the second buildup layer are no thicker than the thickness of conductive layer (58A) on fourth interlayer resin insulating layer (50A). In addition, thicknesses of conductive layers (158A, 158C) belonging to the second buildup layer are no thicker than the thickness of conductive layer (58E) on second interlayer resin insulating layer (50E). It is preferred that the thicknesses of conductive layer (58A) and the conductive layer (58E) be thicker than the thicknesses of conductive layers (158A, 158C) belonging to the second buildup layer. A high-speed signal can be transmitted in a direction horizontal to the printed wiring board. Particularly, it is preferred that a value obtained by dividing the thickness of conductive layer (58A) or conductive layer (58E) by the thickness of the uppermost conductive layer be greater than 1.0. Transmission loss involving high-speed signals of 1.0 GHz or more is reduced. Conductive layers (58G, 158A, 158C) of different layers are connected to via conductors (160A, 160C) passing through the interlayer resin insulating layer. Conductive layers (58A, 58E) include a signal line for transmitting a high-speed signal.

It is preferred that thicknesses of interlayer resin insulating layers (50A, 50C, 50E, 50G) of the first buildup layer (500F) be thicker than the thicknesses of interlayer resin insulating layers (150A, 150C) of second buildup layer (600F). The thickness of the signal line interposed in the interlayer resin insulating layer of the first buildup layer may increase. It is preferred that a value obtained by dividing the thickness of the interlayer resin insulating layer of the first buildup layer by the thickness of the uppermost interlayer resin insulating layer be greater than 1.5. Transmission loss involving high-speed signals of 6.0 GHz or higher is reduced.

It is preferred that a value of the relative permittivity of the interlayer resin insulating layer of the first buildup layer be equal to or greater than a value of the relative permittivity of the uppermost interlayer resin insulating layer. A high-speed signal can be transmitted in a horizontal direction of the printed wiring board. It is preferred that a value (EV) obtained by dividing the value of the relative permittivity of the interlayer resin insulating layer of the first buildup layer by the value of the relative permittivity of the uppermost interlayer resin insulating layer be greater than 1.0. Transmission loss involving high-speed signals of 3 GHz or higher is reduced. It is preferred that the relative permittivity of the interlayer resin insulating layer of the first buildup layer be greater than the relative permittivity of the uppermost interlayer resin insulating layer. High-speed signal noise of 1.0 GHz or more is reduced. It is preferred that the thicknesses and materials of the interlayer resin insulating layers of the second buildup layer be the same. It is also preferred that the thicknesses of the conductive layers of the second buildup layer be the same. Since the interlayer resin insulating layers of the first and second buildup layers are different in thickness or material from each other, inductance of a high-speed signal line can be a predetermined value. When EV is 1.5 or greater, transmission loss involving high-speed signals of 6 GHz or higher is reduced.

Uppermost conductive layer 158C includes multiple IC chip mounting pads (158CP), and a solder bump (76U) for mounting an IC chip on the pad is formed. Pad (158CP) includes a pad (a high-speed signal pad or an upper high-speed signal pad) (158CPH) serving as a high-speed signal input/output terminal, a pad (a low-speed signal pad or an upper low-speed signal pad) (158CPL) serving as a low-speed signal input/output terminal, and a ground pad connected to a ground electrode of the IC chip. Via conductor (160C) formed in uppermost interlayer resin insulating layer (150C) has a via conductor (160CH) connecting high-speed signal pad (158CPH) to the first signal line. Via conductor (160A) formed in the upper interlayer resin insulating layer has a via conductor (160AH) connecting the high-speed signal pad to the first signal line. Via conductor (60G) formed in first interlayer resin insulating layer (50G) has a via conductor (60GH) connecting the high-speed signal pad to the first signal line.

Figure 28:
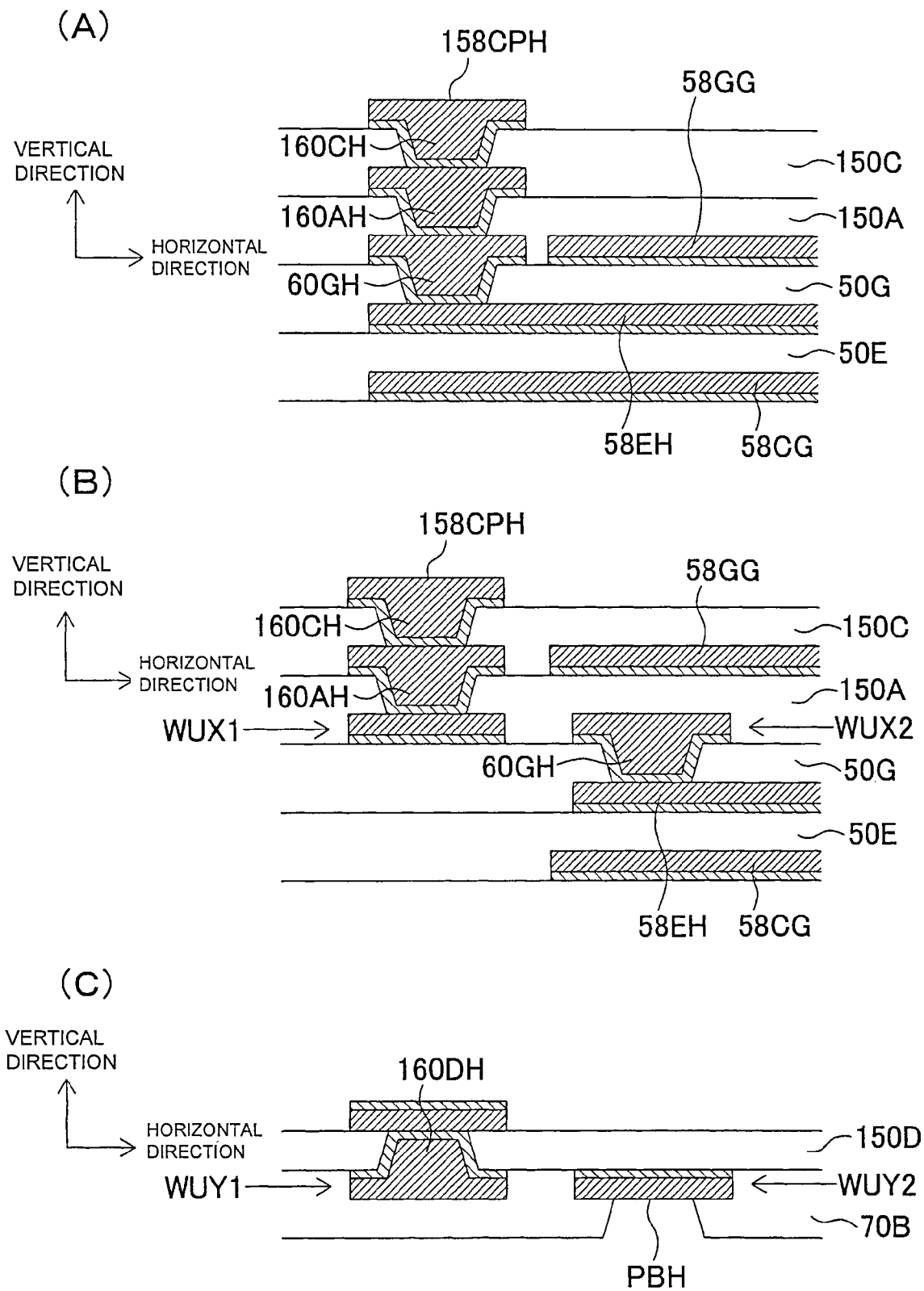
FIGS. 28A to 28C are cross-sectional views illustrating part of the printed wiring board of the first embodiment.

Via conductor (uppermost high-speed signal via conductor) (160CH) formed in the uppermost interlayer resin insulating layer and connecting the high-speed signal pad to the first signal line is formed immediately above via conductor (upper high-speed signal via conductor) (160AH) formed in upper interlayer resin insulating layer (150A) and connecting the high-speed signal pad to the first signal line. Upper high-speed signal via conductor (160AH) is formed immediately above via conductor (high-speed signal via conductor of the first interlayer resin insulating layer) (60GH) formed in first interlayer resin insulating layer (50G) and connecting the high-speed signal pad to the first signal line. The high-speed signal is transmitted to an outer periphery of the printed wiring board through the first signal line (58EH) (FIG. 28A). The high-speed signal is not transmitted through the conductive layer belonging to the second buildup layer beyond a predetermined distance in a direction horizontal to the printed wiring board. The predetermined distance is, for example, 0.1 mm.

Figure 27:
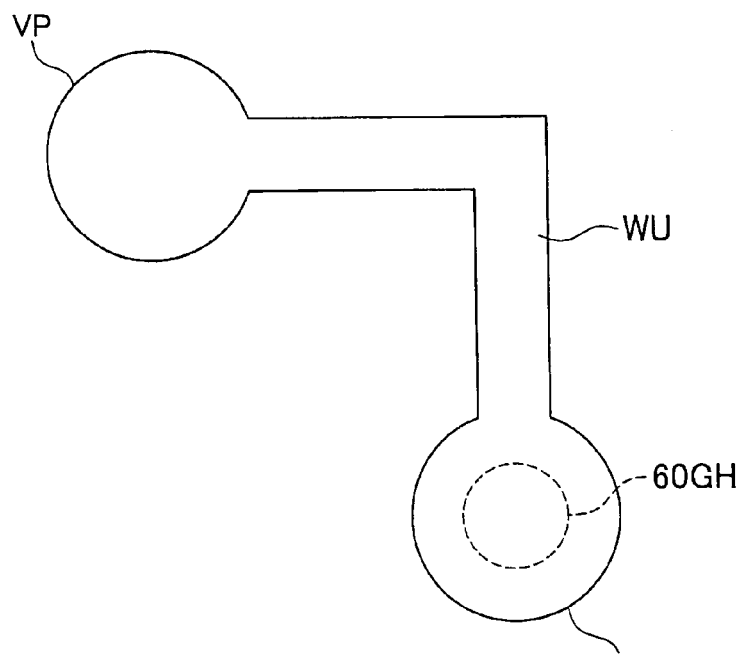
FIGS. 27A and 27B are diagrams illustrating examples of a bypass connection line.
Figure 27:
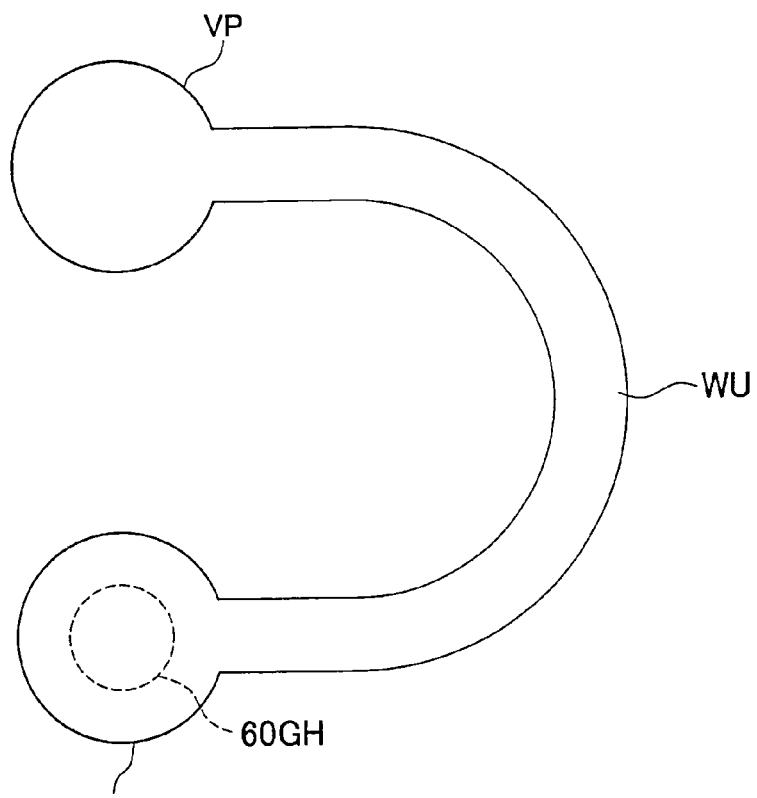
Figure 30:
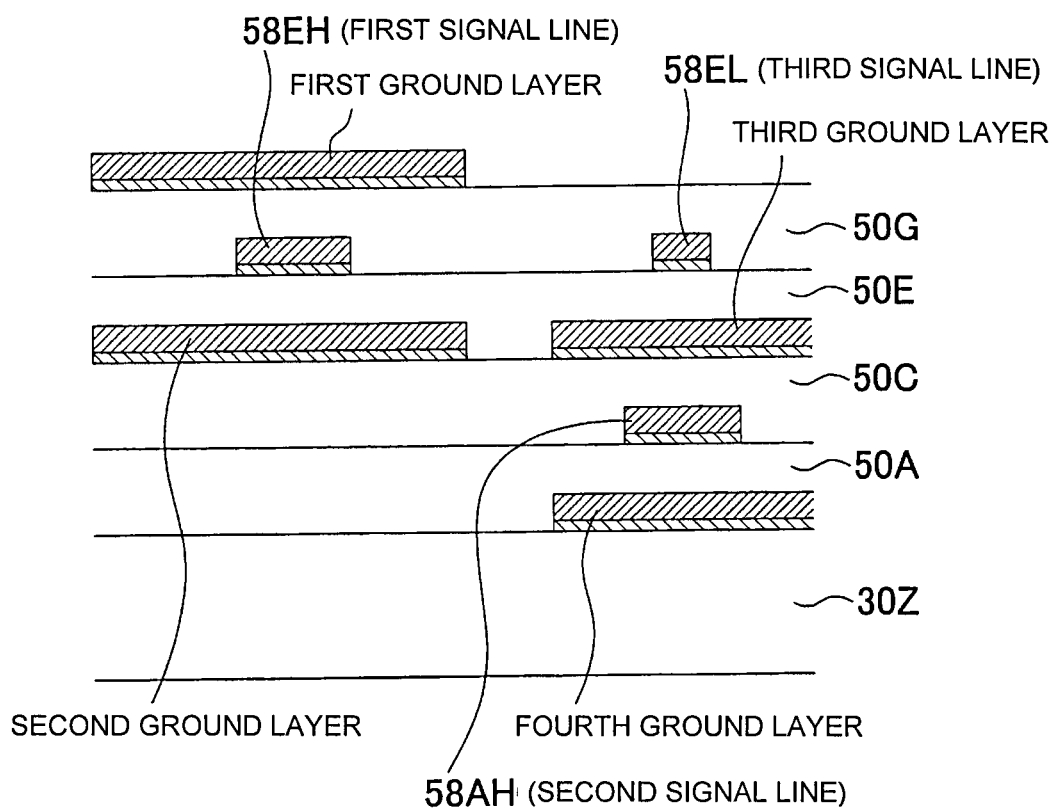
FIG. 30 is a cross-sectional view illustrating part of the printed wiring board of the first embodiment.

A bypass connection line may be formed between via conductor (160CH) formed in the uppermost interlayer resin insulating layer and connecting the high-speed signal pad to the first signal line and via conductor (60GH) formed in first interlayer resin insulating layer (50G) and connecting the high-speed signal pad to the first signal line. Impedance is adjusted by the bypass connection line. An example of bypass connection line (WU) is illustrated in FIG. 22A to FIG. 23C. Bypass connection line (WU) is formed on the first interlayer insulating layer or on the upper interlayer resin insulating layer. It is preferably formed on the first interlayer resin insulating layer. Noise is reduced. When uppermost high-speed signal via conductor (160CH) is formed immediately above upper high-speed signal via conductor (160AH), a bypass connection line is preferred to be formed between upper high-speed signal via conductor (160AH) and high-speed signal via conductor (60GH) of the first interlayer resin insulating layer (FIG. 28B). Noise is reduced. FIG. 28B is a cross-sectional view illustrating part of the printed wiring board of the first embodiment, and FIGS. 27A and 27B are plan views between WUX1 and WUX2 of FIG. 28B. A pad (a via pad) (VP) is illustrated in FIG. 27A and FIG. 27B. Upper high-speed signal via conductor (160AH) is formed immediately above pad (VP). As illustrated in FIGS. 27A and 27B, a bypass connection line is formed between pad (VP) and via conductor (60GH). The conductive layer including a high-speed signal line of the first buildup layer may have a third signal line (58EL) (FIG. 30). A low-speed signal is transmitted by the third signal line. Here, a high-speed signal 1.0 GHz or higher, and a low-speed signal is 100 MHz or lower. The width of the third signal line is narrower than the width of the first signal line.

Figure 24:
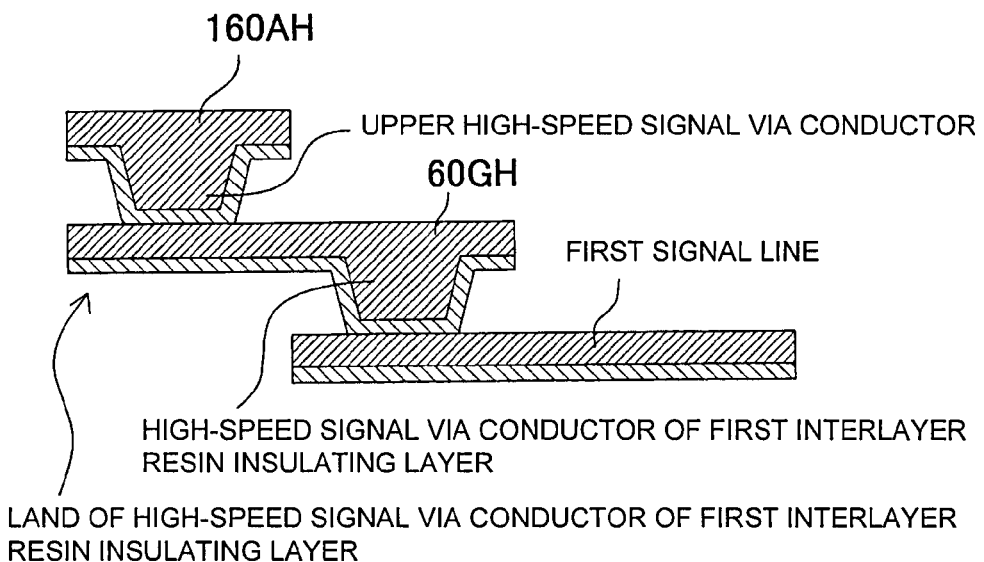
FIG. 24A is a cross-sectional view of a via conductor.
FIG. 24B is a plan view illustrating an upper surface of a land.
Figure 24:
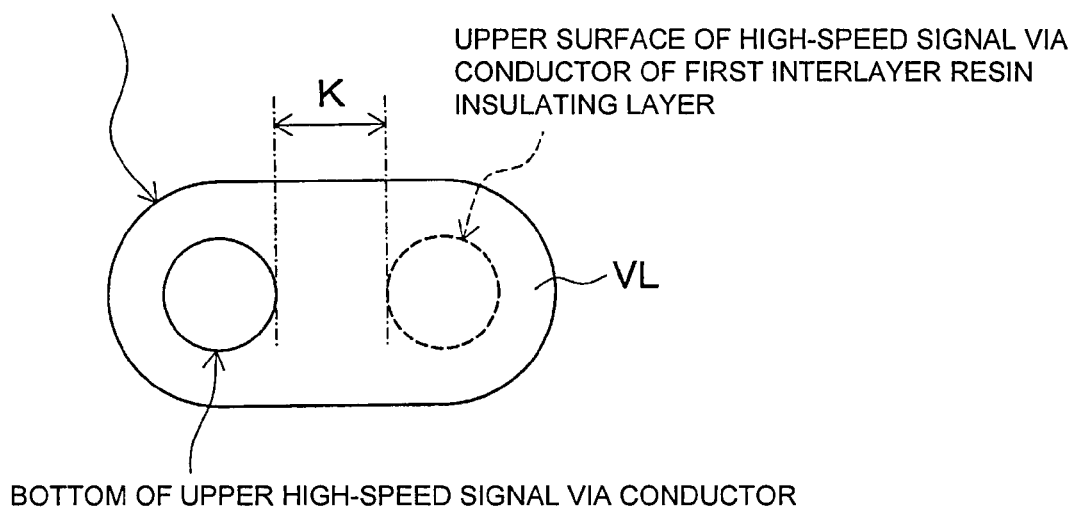
Figure 25:
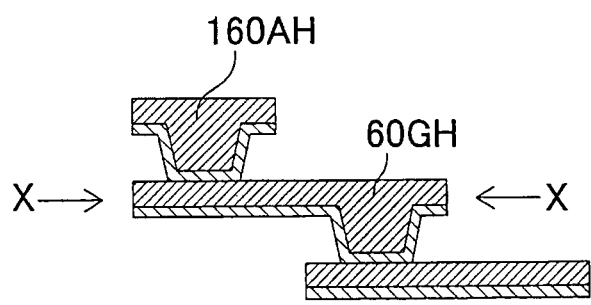
FIGS. 25A to 25F are diagrams illustrating examples of connection between a via conductor of a first buildup layer and a via conductor of a second buildup layer.
Figure 25:
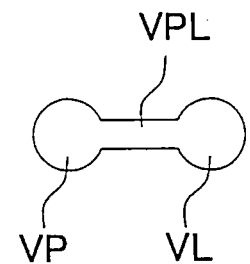
Figure 25:
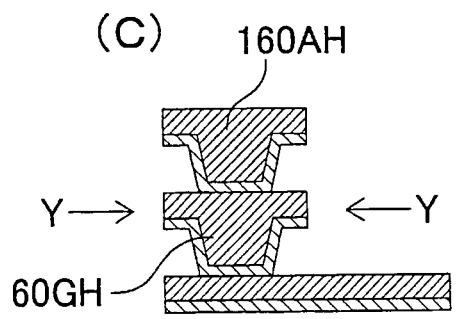
Figure 25:
Figure 25:
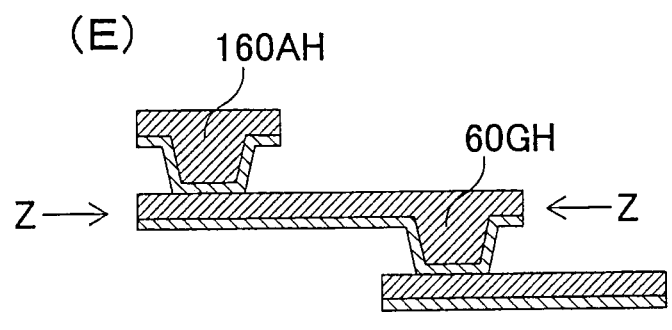
Figure 25:
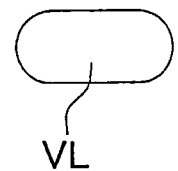

Since the interlayer resin insulating layers of the first buildup layer and the second buildup layer differ from each other in material or thickness, it is easy to concentrate stress between the via conductor of the first buildup layer and the via conductor of the second buildup layer. In order to reduce the stress, the uppermost high-speed signal via conductor is formed immediately above the upper high-speed signal via conductor, and it is preferred that the upper high-speed signal via conductor and the high-speed signal via conductor of the first interlayer resin insulating layer be offset. Examples are illustrated in FIGS. 25A, 25B, 25E and 25F. Connection defects seldom occur between the via conductor of the first buildup layer and the via conductor of the second buildup layer. Particularly, when the thickness of the interlayer resin insulating layer of the first buildup layer is thicker than the thickness of the interlayer resin insulating layer of the second buildup layer, it is preferred that the upper high-speed signal via conductor and the high-speed signal via conductor of the first interlayer resin insulating layer be offset. In this case, it is preferred that the via conductor of the second buildup layer be connected to a land of the high-speed signal via conductor of the first interlayer resin insulating layer (FIGS. 24A and 24B). FIG. 24A is a cross-sectional view, and FIG. 24B is a plan view that illustrates an upper surface of a land.

Upper buildup layers are formed in the first buildup layer (the upper first buildup layer) and the second buildup layer (the upper second buildup layer). When there is no upper interlayer resin insulating layer, via conductor (160AH) illustrated in FIGS. 24A to 25F corresponds to via conductor (160CH).

Lower first buildup layer (500S) is formed on second surface (S) of core substrate 30. Lower first buildup layer (500S) is the same as the upper first buildup layer. Lower second buildup layer (600S) is formed on the lower first buildup layer. The lower second buildup layer and the upper second buildup layer are the same. Lower first buildup layer (500S) includes four interlayer resin insulating layers (50B, 50D, 50F, 50H). Lower second buildup layer (600S) includes two interlayer resin insulating layers (150B, 150D). The interlayer resin insulating layer of lower first buildup layer (500S) may be formed only by the interlayer resin insulating layer of the upper second buildup layer, without including the interlayer resin insulating layer of the upper first buildup layer.

The lower buildup layer is formed in the interlayer resin insulating layer and the conductive layer, which are alternately laminated, and the conductive layer of the other layer is connected to the via conductor formed in the interlayer resin insulating layer. The lower buildup layer is formed in the lower first and second buildup layers.

A solder mask layer (70A) having an opening (71A) is formed on upper second buildup layer (600F). A solder mask layer (70B) having an opening (71B) is formed on lower second buildup layer (600S). Conductive layers (158C, 158D) and the upper surfaces of via conductors (160C, 160D) exposed by the opening of the solder mask layer serve as pads. A metal film 72 such as Ni/Pd/Au is formed on the pad, and solder bumps (76U, 76D) are formed on the metal film. The IC chip is mounted on the printed wiring board through solder bump (76U) formed on the upper buildup layer. The printed wiring board is mounted on the main board through solder bump (76D) formed on the lower buildup layer.

Lower second buildup layer (600S) has a lowermost interlayer resin insulating layer (150D). In addition, the lower second buildup layer has a lowermost via conductor (160D) passing through the lowermost interlayer resin insulating layer and electrically connected to the first signal line. Via conductor (160D) includes a lowermost high-speed signal via conductor (160DH). In addition, the lower buildup layer has a BGA pad (PB) for connection to the main board on the lowermost interlayer resin insulating layer. BGA pad (PB) of the lower buildup layer has a lower high-speed signal pad (PBH) (FIG. 28C). The bypass connection line illustrated in FIGS. 22A to 23C may be formed between the lowermost high-speed signal via conductor and the lower high-speed signal pad. The bypass connection line is formed on lowermost interlayer resin insulating layer (150D) between WUY1 and WUY2 of FIG. 28C. The bypass connection line is included in conductive layer (the lowermost conductive layer) (158D) on the lowermost interlayer resin insulating layer. Impedance is controlled by the connection line.

The lower buildup layer may be the same as the upper buildup layer. That is, the same buildup layer as the upper first buildup layer is formed on the second surface of the core substrate. The same buildup layer as the upper second buildup layer is formed on the lower first buildup layer. When the printed wiring board has such buildup layers, the structure of the core substrate is symmetrical up and down, and thus bending of the printed wiring board is reduced.

Figure 26:
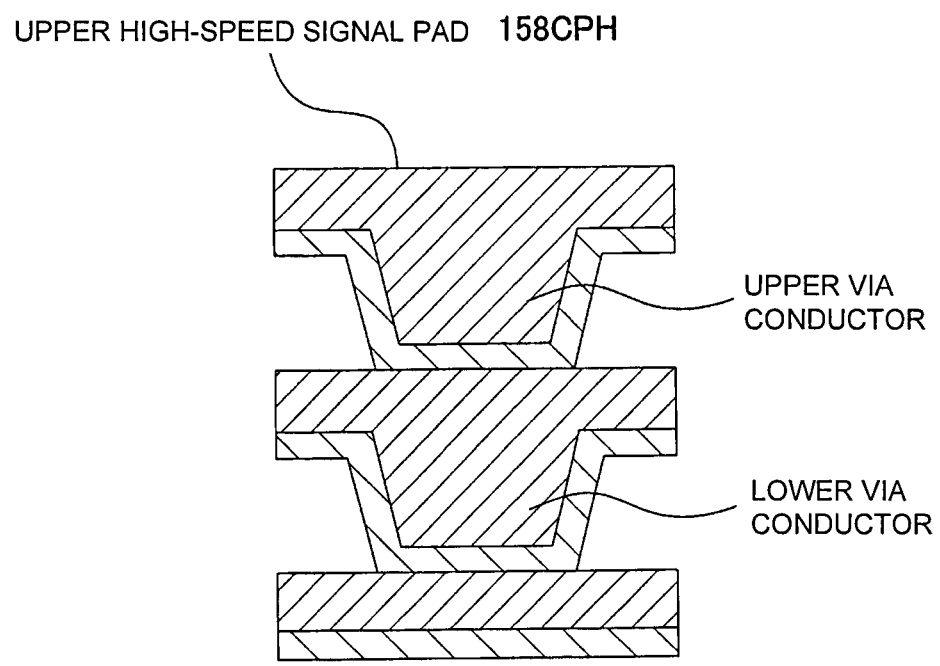
FIG. 26 is a diagram illustrating a stacked via.

The high-speed signal reaches a via pad (VP) on the first interlayer resin insulating layer, an upper surface (VU) of high-speed signal via conductor (60GH) of the first interlayer resin insulating layer, or a land (VL) of the high-speed signal via conductor of the first interlayer resin insulating layer, from the upper high-speed signal pad through the via conductor of the upper second buildup layer. FIGS. 25A, 25C and 25E are cross-sectional views. FIG. 25B is a plan view of a portion X-X of FIG. 25A, FIG. 25D is a plan view of a portion Y-Y of FIG. 25C, and FIG. 25F is a plan view of a portion Z-Z of FIG. 25E. In FIGS. 25A and 25B, via pad (VP) and via land (VL) (the land of the high-speed signal via conductor of the first interlayer resin insulating layer) are connected by a connection line (VPL). In FIG. 25F, the via pad and the via land are formed as one. Here, via pad (VP) on the first interlayer resin insulating layer, upper surface (VU) of the high-speed signal via conductor of the first interlayer resin insulating layer, and land (via land) (VL) of the high-speed signal via conductor of the first interlayer resin insulating layer are referred to as an input terminal to the upper first buildup layer. It is preferred that the via conductor of the second buildup layer formed between the input terminal to the upper first buildup layer and the upper high-speed signal pad be a stacked via. In the stacked via, the upper via conductor is laminated on the lower via conductor as illustrated in FIG. 26. In addition, it is preferred that the stacked via of the second buildup layer be formed immediately under the upper high-speed signal pad. Noise of the high-speed signal is reduced. When the high-speed signal is transmitted between the upper high-speed pad and the input terminal to the upper first buildup layer in a horizontal direction by the connection line in the second buildup layer, it is preferred that the distance be 0.1 mm or shorter. High-speed signal transmission loss is reduced.

When the input terminal to the upper first buildup layer is the upper surface of the via conductor of the first interlayer resin insulating layer, the high-speed signal is transmitted to the first buildup layer over the shortest distance.

When the input terminal to the upper first buildup layer is via pad (VP), it is preferred that there be a bypass connection line (WU) between the via pad and high-speed signal via conductor 60GH of the first interlayer resin insulating layer. An example is illustrated in FIGS. 27A and 27B. Impedance is controlled. When there is no bypass connection line, it is preferred that the distance between them be 0.1 mm or shorter. High-speed signal transmission loss is reduced.

When the input terminal to the upper first buildup layer is the via land, connection reliability between the via conductor of the upper first buildup layer and the via conductor of the upper second buildup layer is high. It is preferred that a distance (K) between the upper high-speed signal via conductor and the high-speed signal via conductor of the first interlayer resin insulating layer be 0.1 mm (FIG. 24B) or shorter. High-speed signal transmission loss is reduced.

When the thickness of the interlayer resin insulating layer of the first buildup layer is 30 µm or thicker and a value obtained by dividing the thickness of the interlayer resin insulating layer of the first buildup layer by the thickness of the interlayer resin insulating layer of the second buildup layer is greater than 1, the input terminal to the first buildup layer is the via land or the via pad, and peeling seldom occurs between the input terminal to the first buildup layer and the high-speed signal via conductor of the upper second buildup layer.

The high-speed signal reaches first signal line (58EH) from the input terminal to the first buildup layer through high-speed signal via conductor (60GH) of the upper first interlayer resin insulating layer. The high-speed signal is transmitted in a direction horizontal to the printed wiring board by the signal line (FIGS. 28A and 28B). Here, the horizontal direction is a direction substantially parallel to the first surface of the insulating base. Since the first signal line is the stripline, high-speed signal transmission loss is reduced.

When the printed wiring board has a third signal line, it is preferred that a width of the third signal line be smaller than the width of the first signal line. The size of the printed wiring board is reduced. Since the transmission distance is shortened, high-speed signal transmission loss is reduced. High-speed signal transmission and high density are achieved. The third signal line may not be the stripline. It is preferred that the third signal line not be interposed by the ground layers that interpose the first signal line. The signal does not easily deteriorate.

In the first embodiment, the buildup layer is formed of the first buildup layer and the second buildup layer, and the role with respect to the high-speed signal may be changed between the first buildup layer and the second buildup layer. The high-speed signal in the first buildup layer is transmitted mainly in a horizontal direction, and the high-speed signal in the second buildup layer is transmitted mainly in a vertical direction. The vertical direction is a direction perpendicular to the first surface of the insulating base. Since the role with respect to the high-speed signal may be changed between the first buildup layer and the second buildup layer, the printed wiring board of the first embodiment can transmit a high-speed signal of, for example, 1.0 GHz or higher, with low loss. The printed wiring board becomes thin and small. As described above, the roles of the first and second buildup layers are different. Accordingly, in the first embodiment, the interlayer resin insulating layers of the first and second buildup layers differ from each other in thickness. Alternatively, the interlayer resin insulating layers of the first and second buildup layers differ from each other in material.

In the first embodiment, the material of the interlayer resin insulating layer of the first buildup layer is different from the material of the interlayer resin insulating layer of the second buildup layer. For example, the relative permittivity or the dielectric tangent differs between them. Alternatively, the thickness of the interlayer resin insulating layer of the first buildup layer is different from the thickness of the interlayer resin insulating layer of the second buildup layer. For this reason, characteristics of the high-speed signal are different between the first buildup layer and the second buildup layer. High-frequency signals and low-frequency signals are transmitted with low loss.

Since the printed wiring board of the first embodiment has a first buildup layer and a second buildup layer, multiple frequency signals (low-speed signals and high-speed signals) are transmitted with low loss. In addition, since the interlayer resin insulating layer between the first signal line and the ground layer interposing the first signal line is formed of a single material, the electric field is not easily thrown out of balance. For this reason, the signal waveforms of high-speed signals are not easily broken. Noise does not easily occur.

In the printed wiring board of the first embodiment, the number of interlayer resin insulating layers of the first buildup layer is four. It is preferred that the number of interlayer resin insulating layers of the first buildup layer be an even number. When the number of layers is an even number, the high-speed signal connection line is interposed in the ground layer through the interlayer resin insulating layer. Since the stripline is formed, high-frequency signals are transmitted with low loss. It is preferred that the number of interlayer resin insulating layers of the first buildup layer be two or four. When the number of interlayer resin insulating layers is two, the printed wiring board is thin. Since the connection line is short, loss is reduced. When the number of interlayer resin insulating layers is four, high-speed signals are transmitted efficiently even when there are many high-speed signal input/output terminals. Four layers are preferred.

Figure 2:
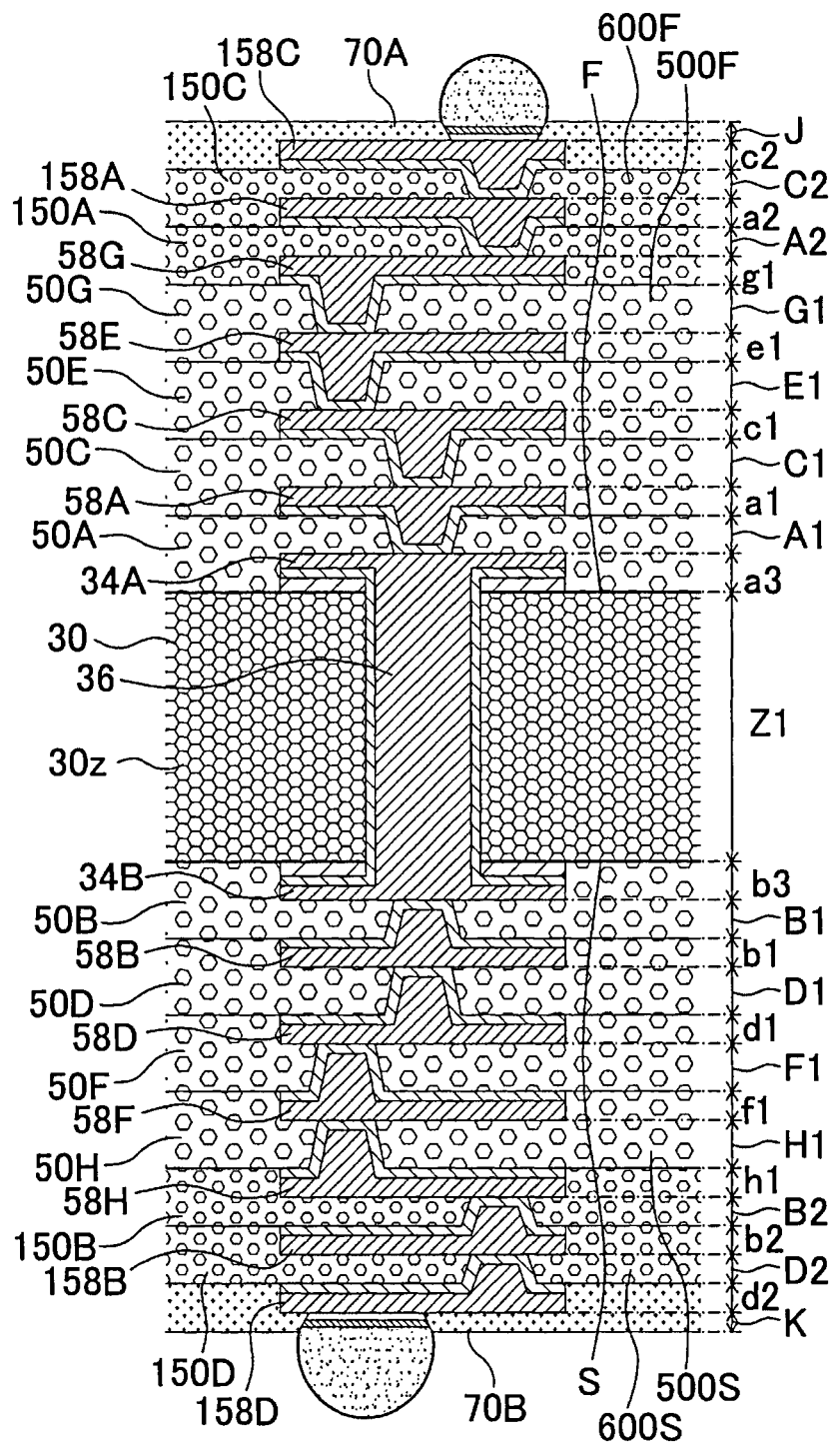
FIG. 2 is a cross-sectional view illustrating part of the printed wiring board of the first embodiment.
Figure 3:
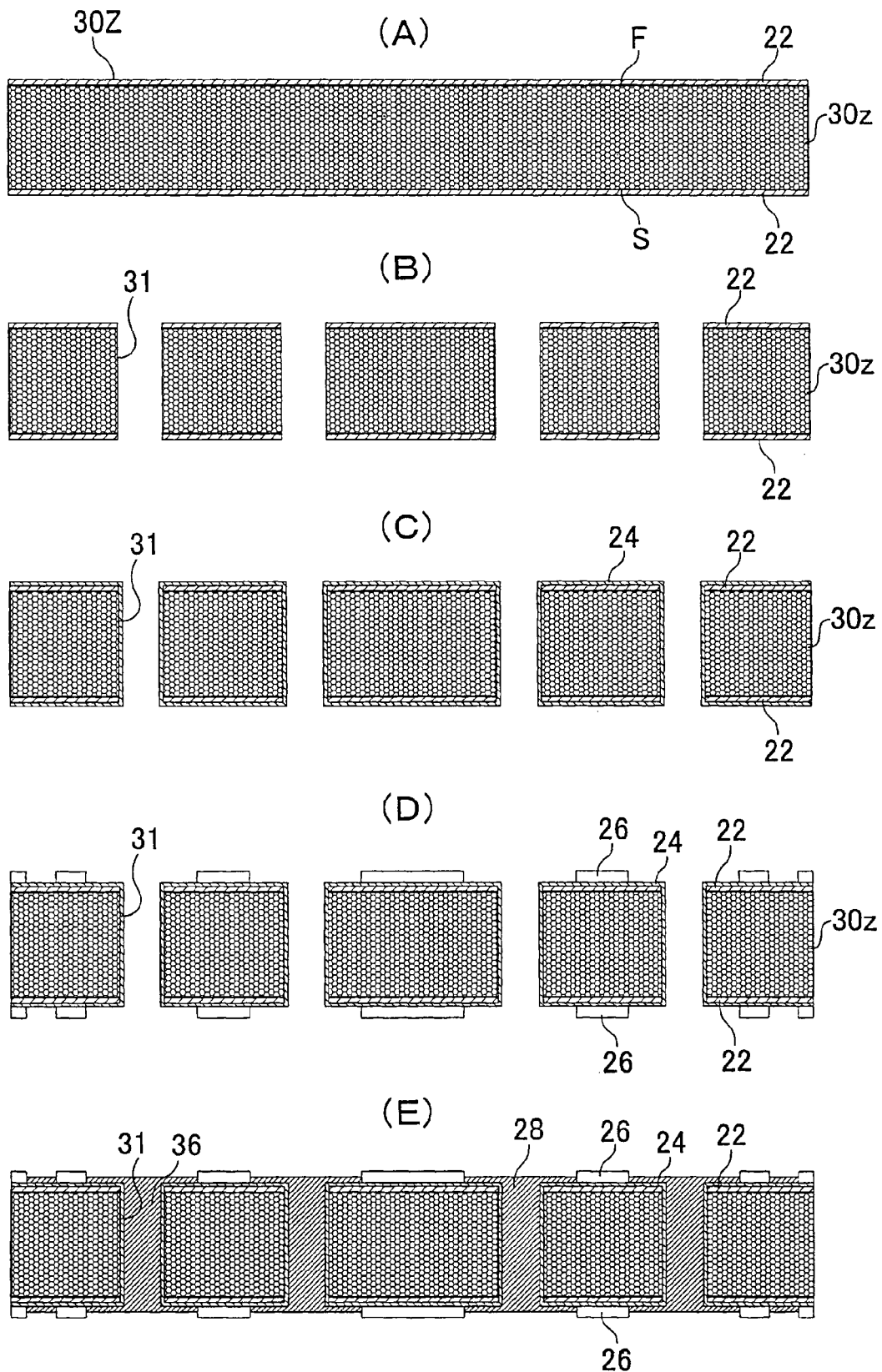
FIGS. 3A to 3E are process diagrams illustrating a method of manufacturing the printed wiring board of the first embodiment.
Figure 4:
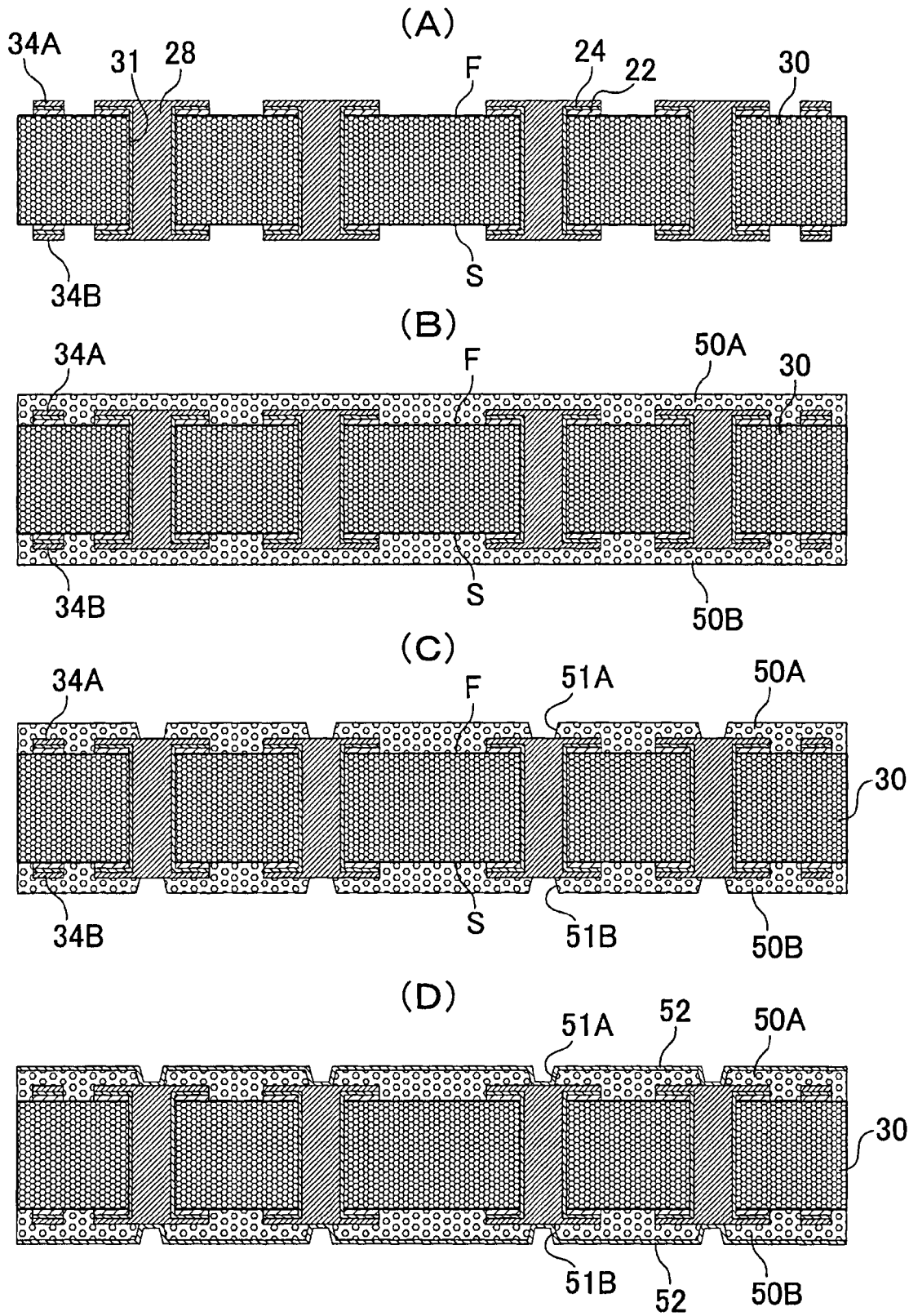
FIGS. 4A to 4D are process diagrams illustrating a method of manufacturing the printed wiring board of the first embodiment.
Figure 5:
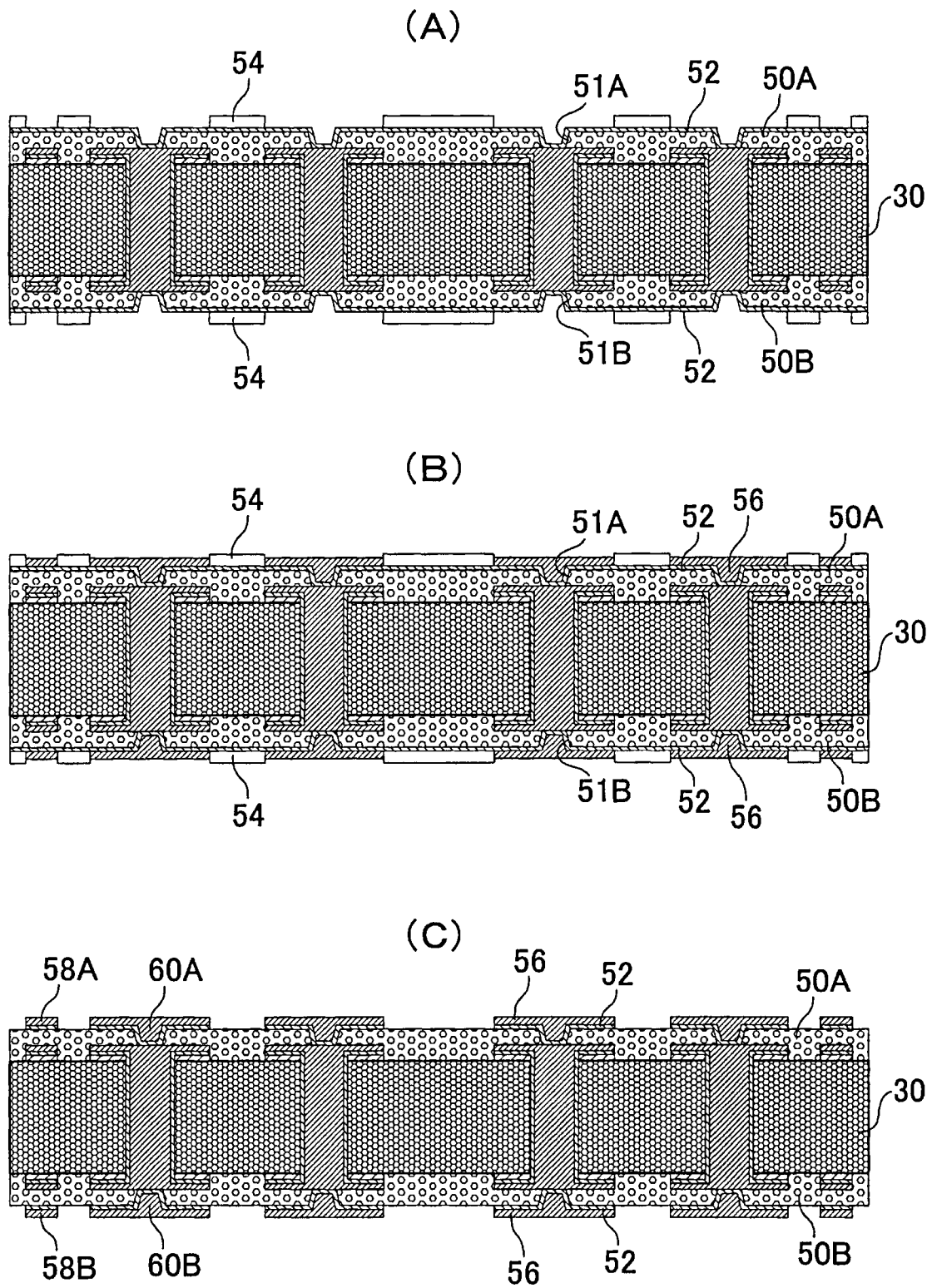
FIGS. 5A to 5C are process diagrams illustrating a method of manufacturing the printed wiring board of the first embodiment.
Figure 6:
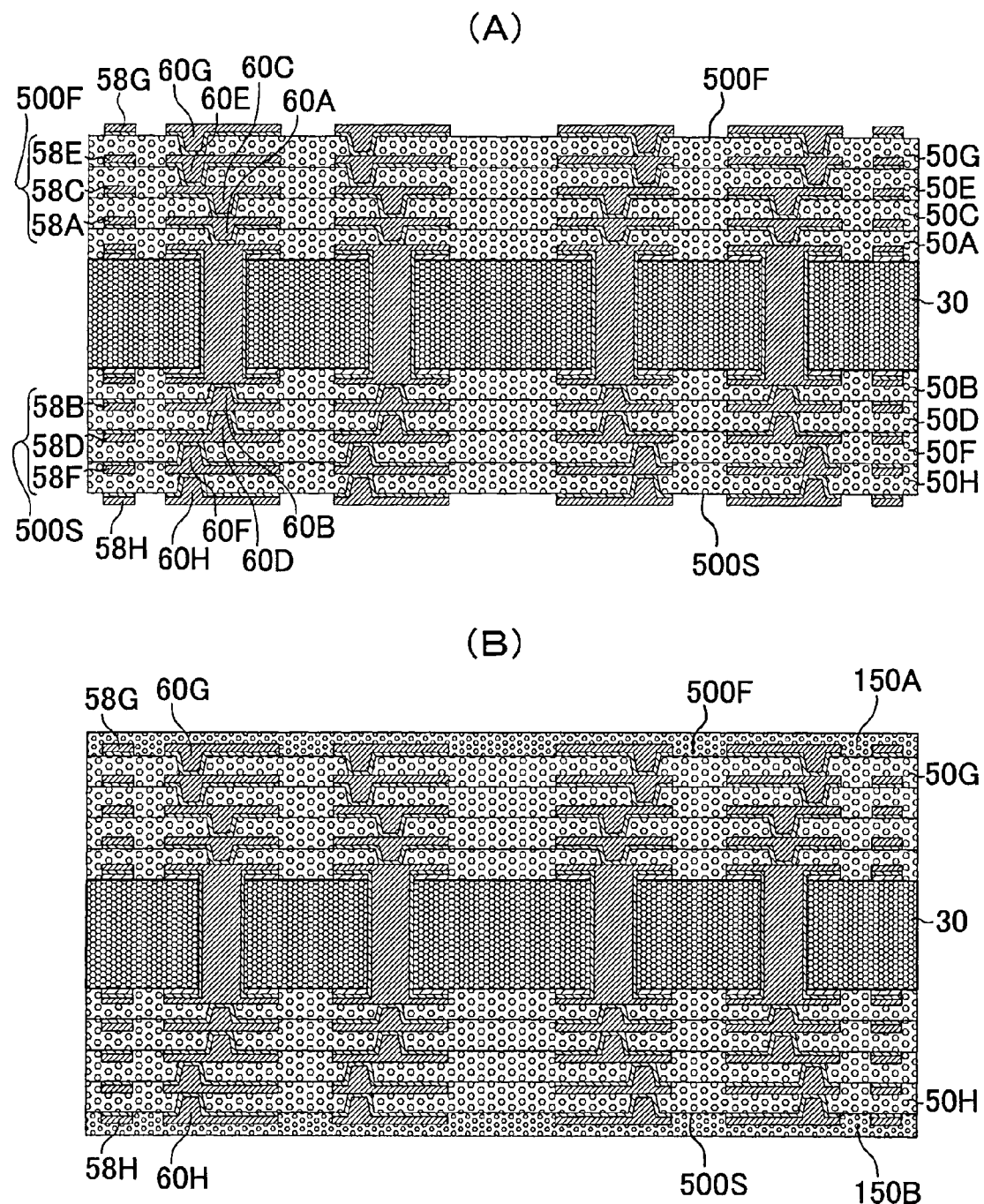
FIGS. 6A and 6B are process diagrams illustrating a method of manufacturing the printed wiring board of the first embodiment.
Figure 7:
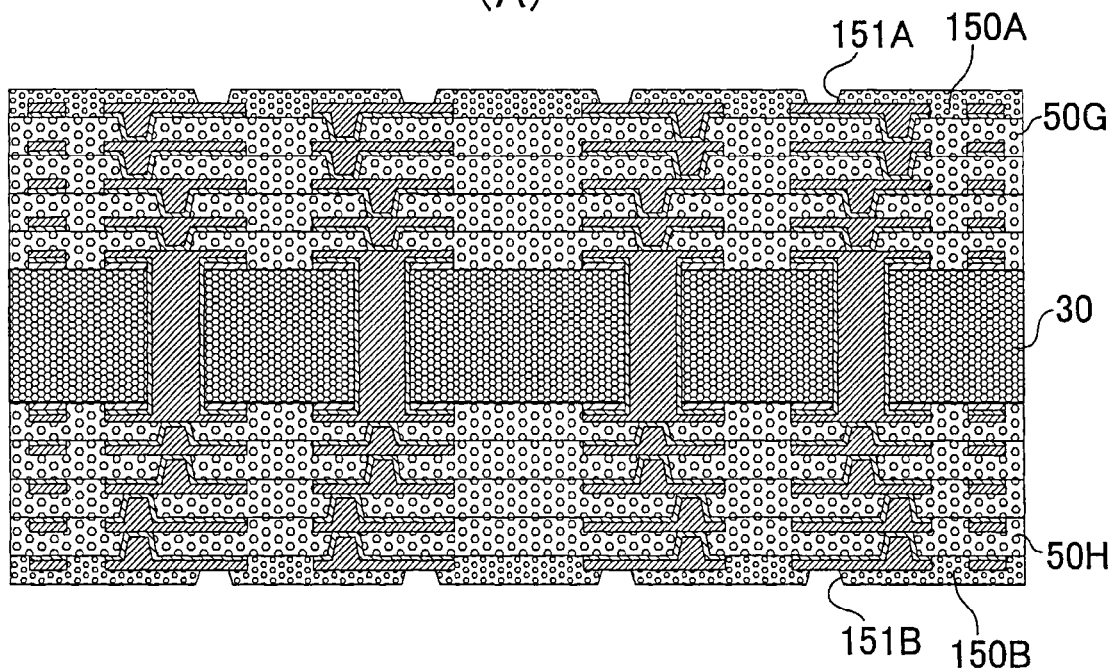
FIGS. 7A and 7B are process diagrams illustrating a method of manufacturing the printed wiring board of the first embodiment.
Figure 7:
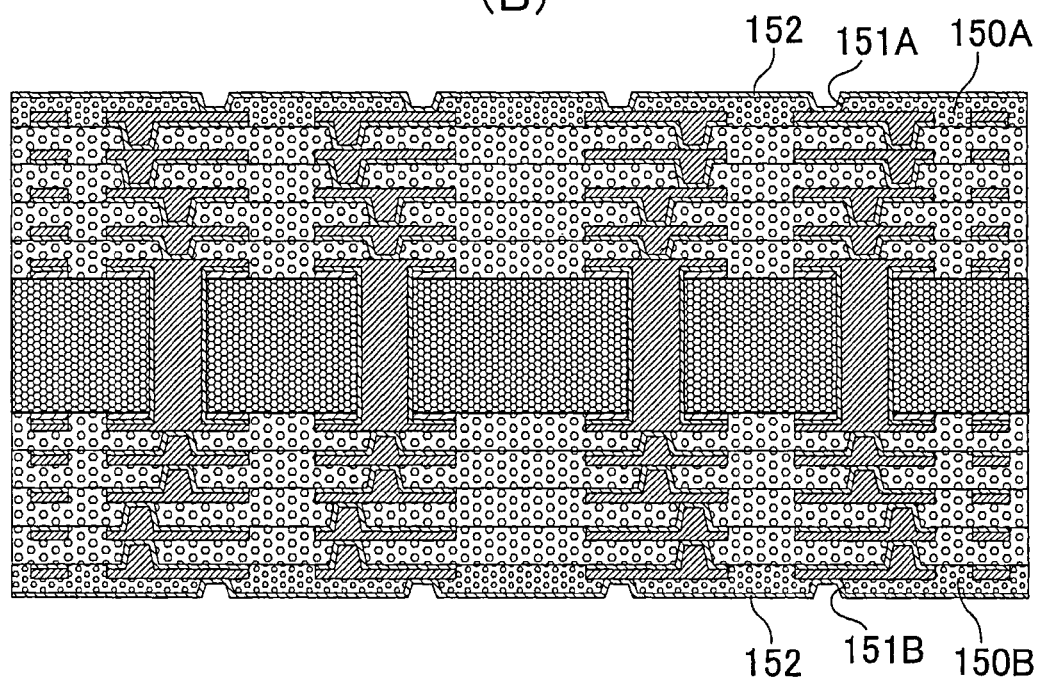
Figure 8:
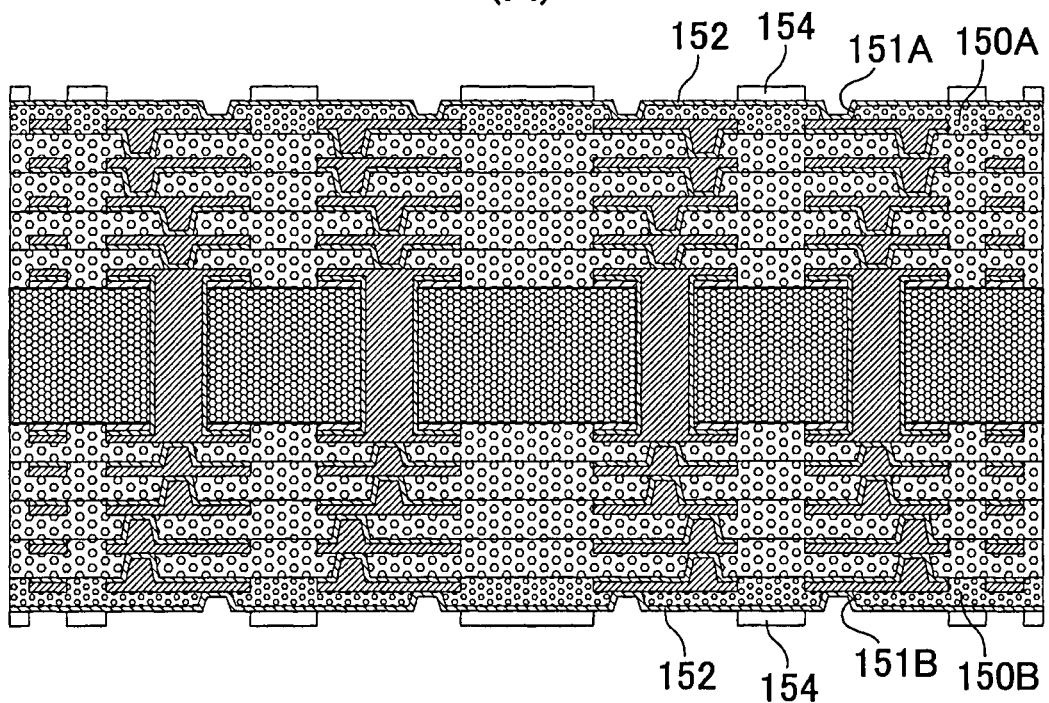
FIGS. 8A and 8B are process diagrams illustrating a method of manufacturing the printed wiring board of the first embodiment.
Figure 8:
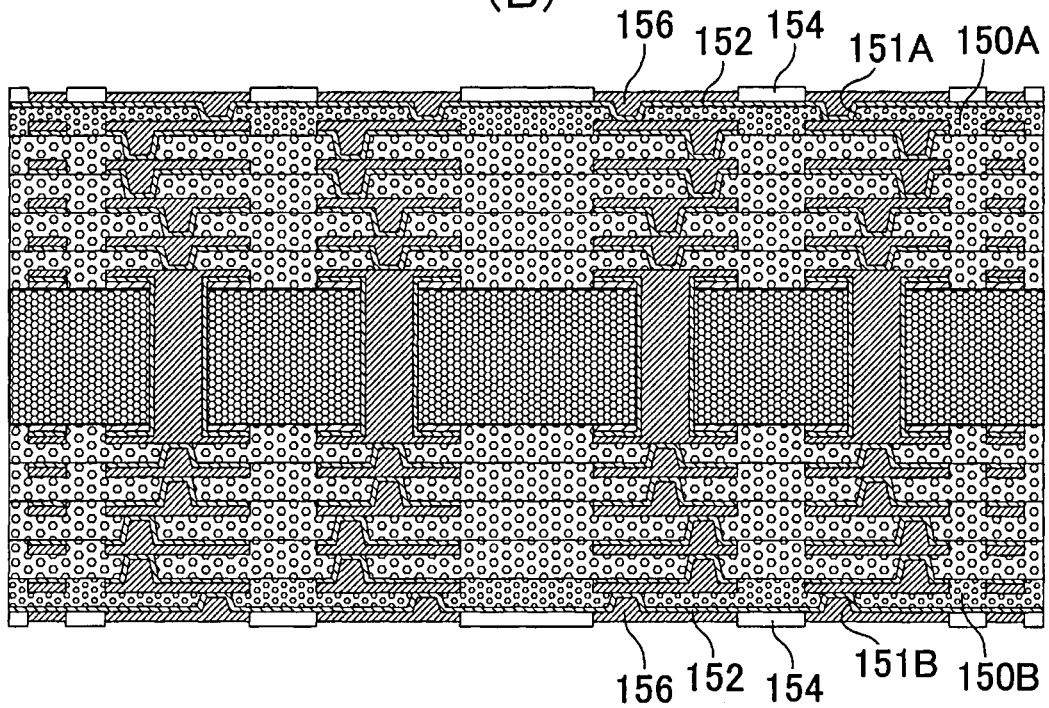
Figure 9:
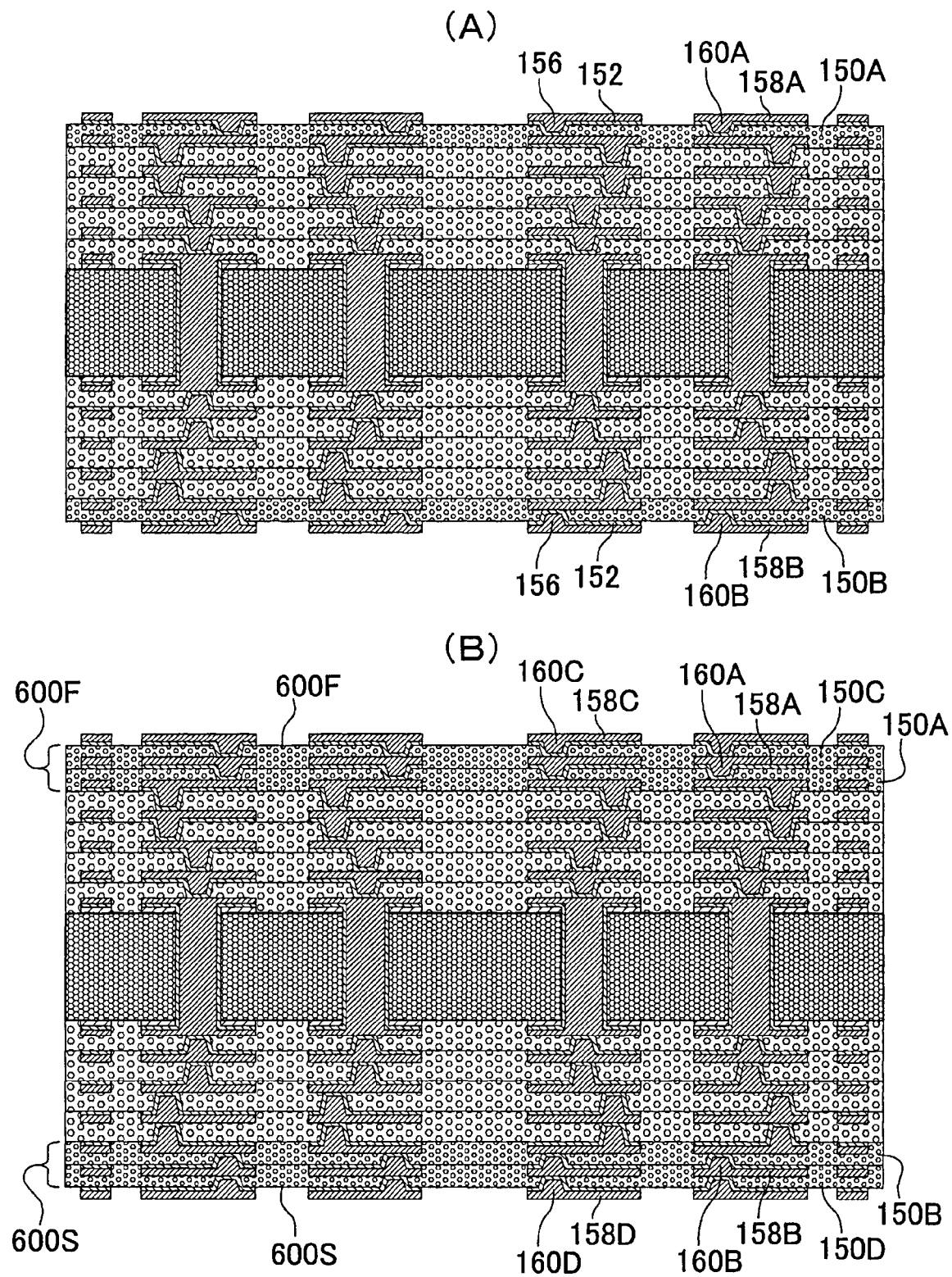
FIGS. 9A and 9B are process diagrams illustrating a method of manufacturing the printed wiring board of the first embodiment.
Figure 10:
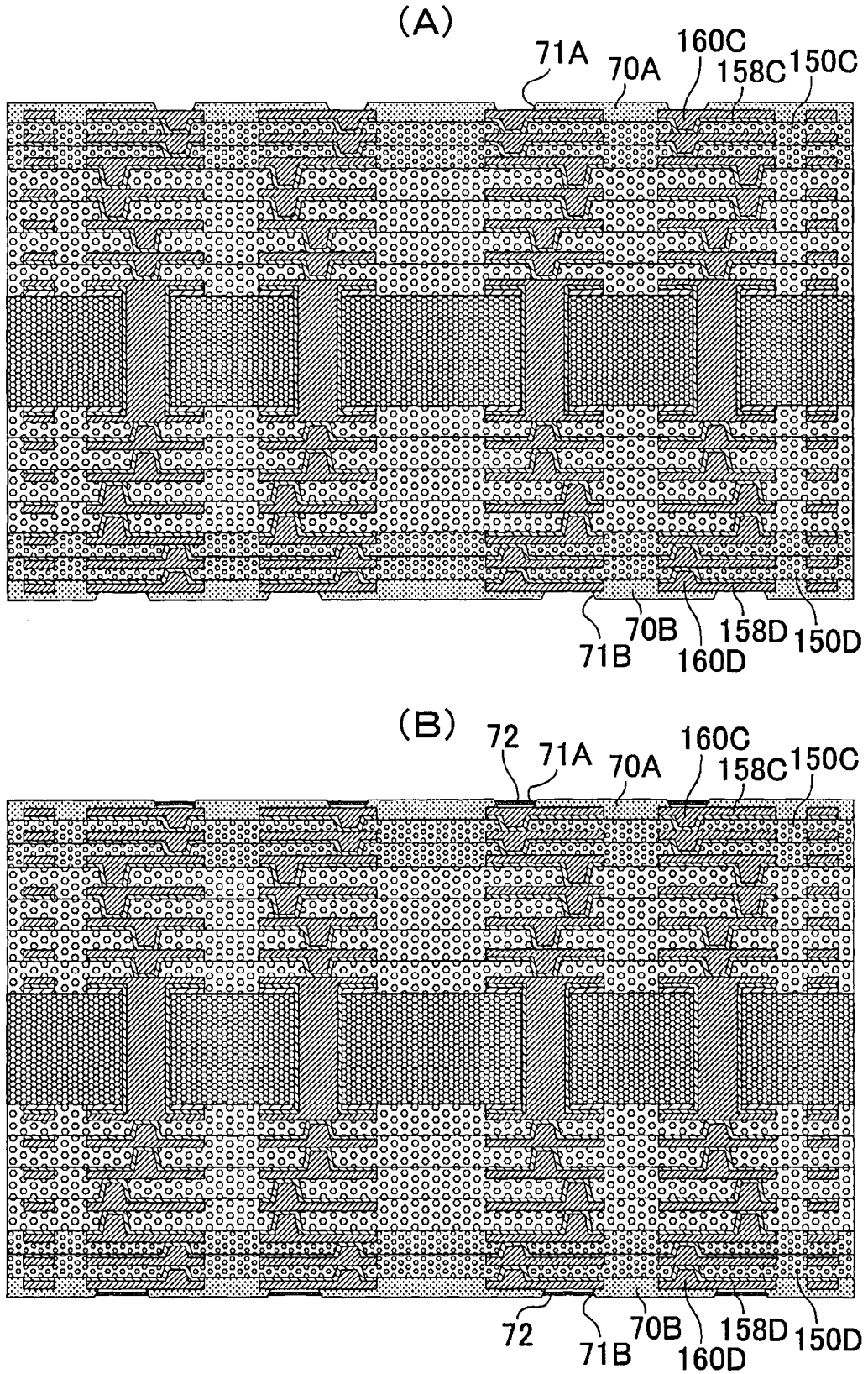
FIGS. 10A and 10B are process diagrams illustrating a method of manufacturing the printed wiring board of the first embodiment.

FIG. 2 enlarges and illustrates part of the printed wiring board of FIG. 1.

Hereinafter, a value of the relative permittivity of the interlayer resin insulating layer, a value of the dielectric tangent, a thickness of the interlayer resin insulating layer, and a thickness of the conductive layer are illustrated. Such values are examples.

An insulating base (30z) of the core substrate has a core member such as glass cloth. The relative permittivity of the insulating base (30z) is 4.8, and the dielectric tangent is 0.015. Insulating base (30z) has thickness (Z1) of 600 μm and has first surface (F) and second surface (S) opposite the first surface. The thicknesses (a3, b3) of the upper conductive layer (34A) of the first surface of insulating base (30z) and lower conductive layer (34B) of the second surface of insulating base (30z) are 21 μm.

Fourth interlayer resin insulating layer (50A) of the first layer of upper first buildup layer (500F) is formed directly on the core substrate, and thickness (A1) thereof is 60 μm. The thickness a1 of conductive layer (58A) on fourth interlayer resin insulating layer (50A) is 15 μm. Thickness (C1) of third interlayer resin insulating layer (50C) of the second layer is 60 μm, and thickness (c1) of conductive layer (58C) on third interlayer resin insulating layer (50C) is 15 μm. Thickness (E1) of second interlayer resin insulating layer (50E) of the third layer is 60 μm. Thickness (e1) of conductive layer (58E) on second interlayer resin insulating layer (50E) is 15 μm. Thickness (G1) of first interlayer resin insulating layer (50G) of the fourth layer is 60 μm. Thickness (g1) of conductive layer (58G) on first interlayer resin insulating layer (50G) is 15 μm.

Upper interlayer resin insulating layer (150A) of upper second buildup layer (600F) is formed on the first interlayer resin insulating layer of the upper first buildup layer, and thickness (A2) thereof is 30 μm. Thickness (a2) of conductive layer (158A) on the upper interlayer resin insulating layer is 12 μm. Thickness (C2) of uppermost interlayer resin insulating layer (150C) on the upper interlayer resin insulating layer is 30 μm. Thickness (c2) of uppermost conductive layer (158C) on the uppermost resin insulating layer is 12 μm. Thickness (J) of solder mask layer (70A) on the upper buildup layer is 21 μm. Since the thickness of the conductive layer of the second buildup layer is shallower than the thickness of the conductive layer of the first buildup layer, bending of the printed wiring board is reduced.

Fourth interlayer resin insulating layer (50B) of the first layer of lower first buildup layer (500S) is formed directly on the second surface of the core substrate, and thickness (B1) thereof is 60 μm. Thickness (b1) of conductive layer (58B) on fourth interlayer resin insulating layer (50B) is 15 μm. Thickness (D1) of third interlayer resin insulating layer (50D) of the second layer is 60 μm. Thickness (d1) of conductive layer (58D) on third interlayer resin insulating layer (50D) is 15 μm. Thickness (F1) of second interlayer resin insulating layer (50F) of the third layer is 60 μm. Thickness (f1) of conductive layer (58F) on second interlayer resin insulating layer (50F) is 15 μm. Thickness (H1) of first interlayer resin insulating layer (50H) of the fourth layer is 60 μm. Thickness (h1) of conductive layer (58H) on first interlayer resin insulating layer (50H) is 15 μm.

Lower interlayer resin insulating layer (150B) of lower second buildup layer (600S) is formed on lower first buildup layer (500S), and thickness (B2) thereof is 30 μm. Thickness (b2) of conductive layer (158B) on the lower interlayer resin insulating layer is 12 μm. Thickness (D2) of lowermost interlayer resin insulating layer (150D) on the lower interlayer resin insulating layer is 30 μm. Thickness (d2) of conductive layer (158D) on the lowermost interlayer resin insulating layer is 12 μm. Thickness (K) of solder mask layer (70B) on lowermost interlayer resin insulating layer (150D) is 21 μm.

Interlayer resin insulating layers (50A, 50C, 50E, 50G, 50B, 50D, 50F, 50H) of upper and lower first buildup layers (500F, 500S) have reinforcement members such as glass cloth. The relative permittivity of the interlayer resin insulating layers of the upper and lower first buildup layers is 3.9, and the dielectric tangent is 0.009. Interlayer resin insulating layer (150A, 150C, 150B, 150D) of the upper and lower second buildup layers (600F, 600S) have reinforcement members, and each thickness is 30 μm. The relative permittivity thereof is 3.1, and the dielectric tangent is 0.019. The relative permittivity of solder mask layers (70A, 70B) is 3.55, and the dielectric tangent is 0.024.

Figure 21:
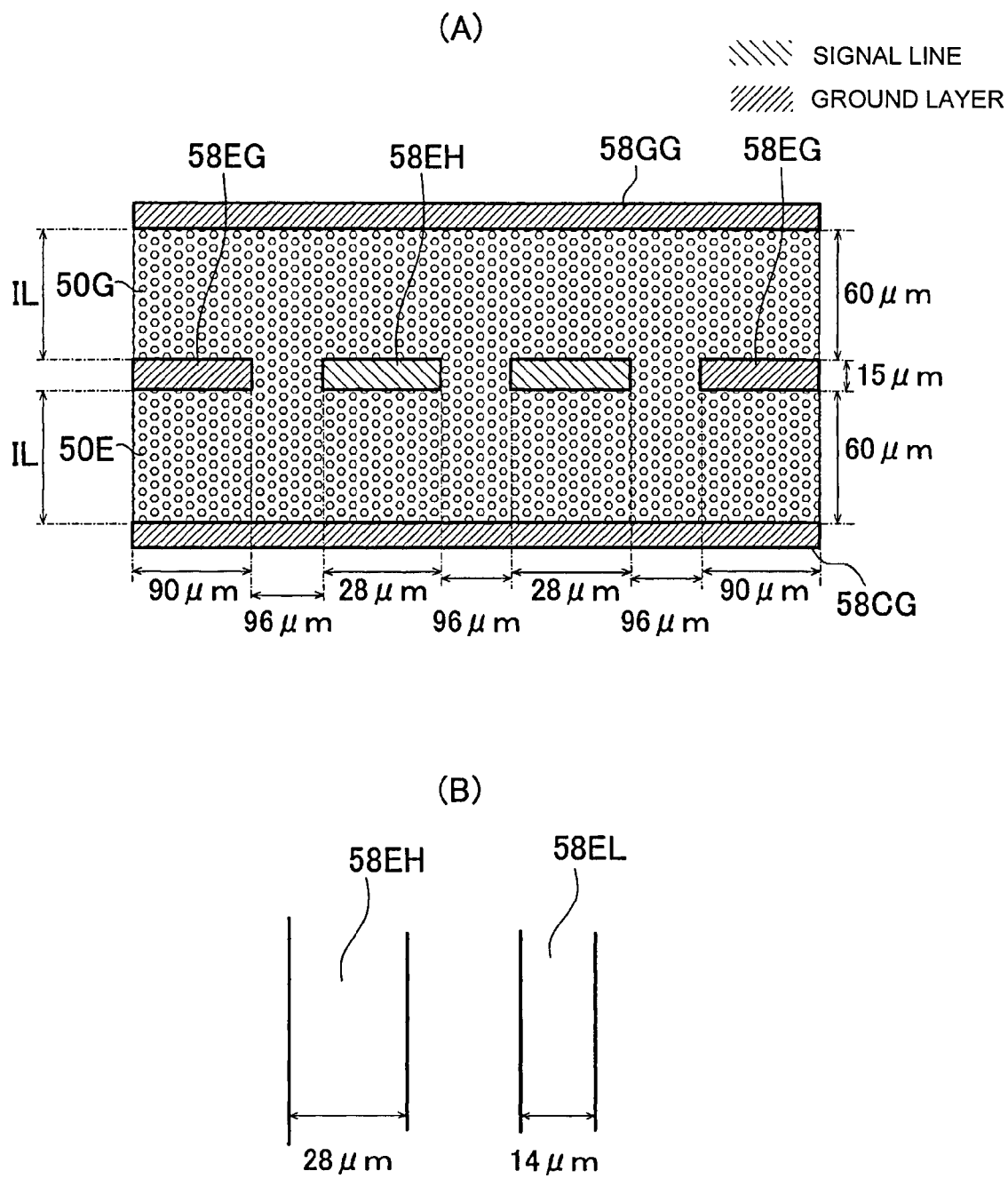
FIGS. 21A and 21B are diagrams illustrating a signal line and a ground layer of the printed wiring board of the first embodiment.
Figure 22:
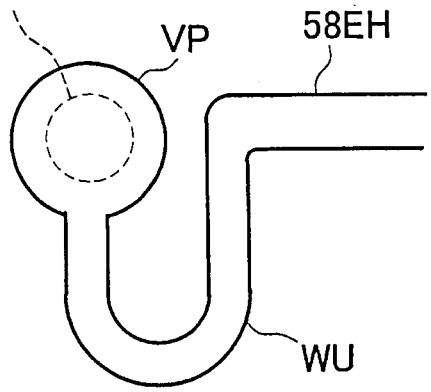
FIGS. 22A and 22B are diagrams illustrating examples of a bypass connection line.
Figure 22:
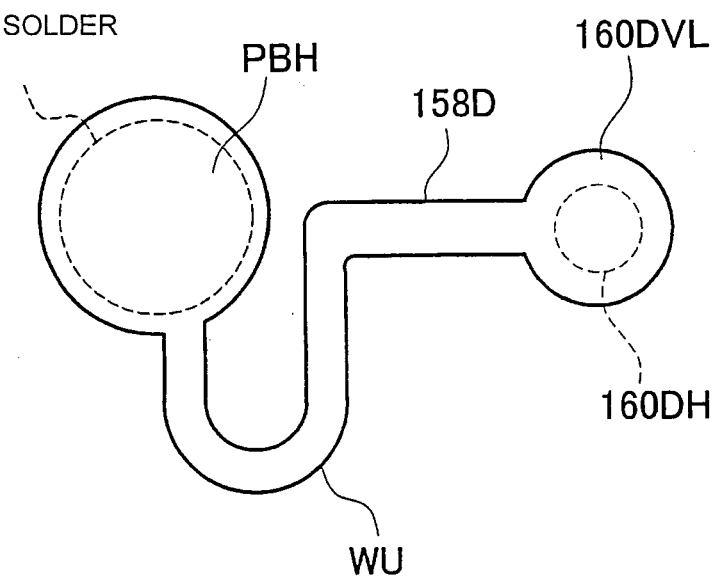
Figure 23:
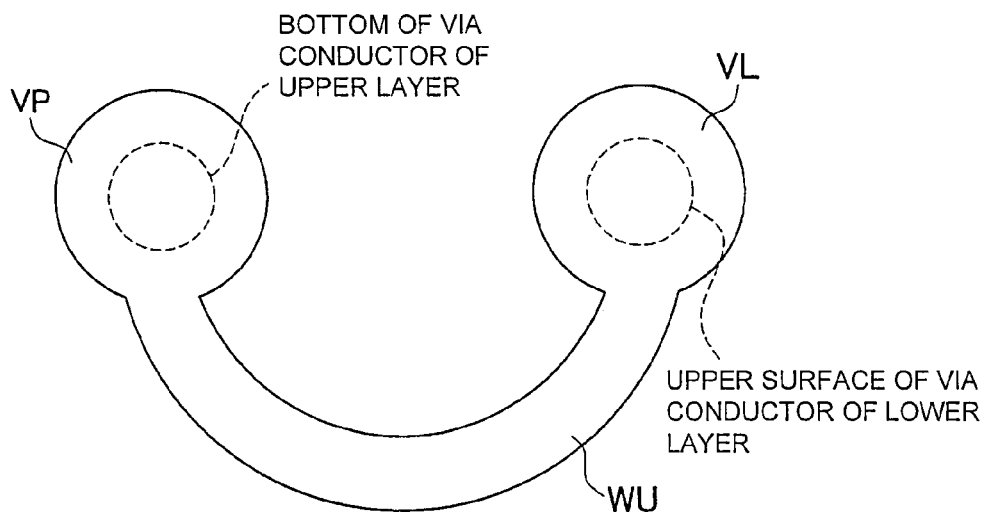
FIGS. 23A to 23C are diagrams illustrating examples of a bypass connection line.
Figure 23:
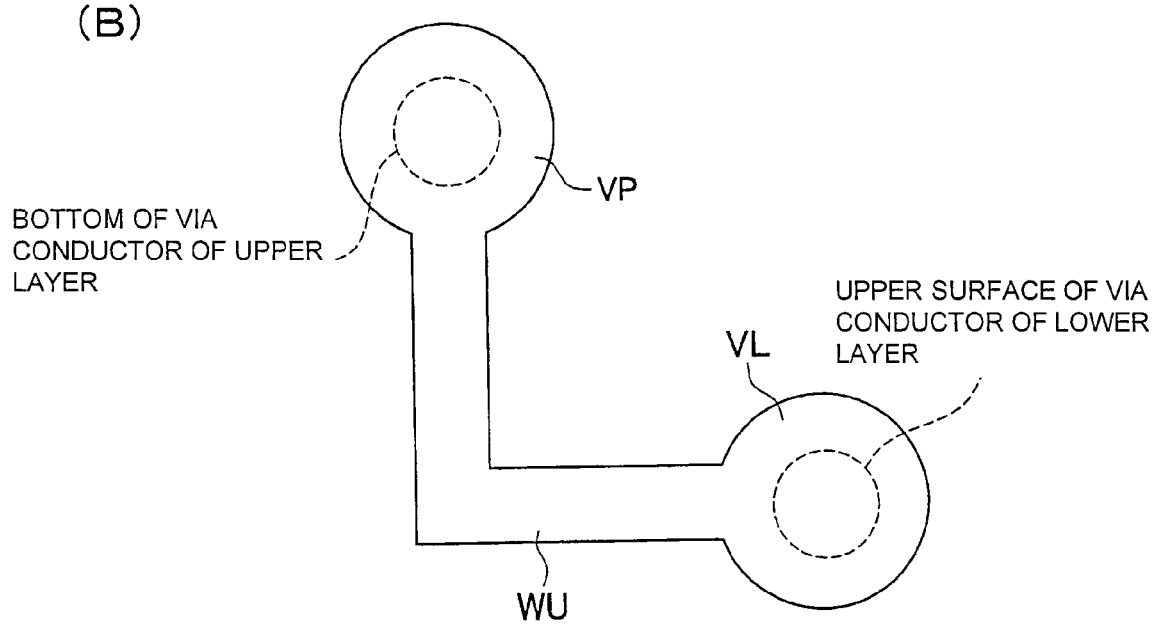
Figure 23:
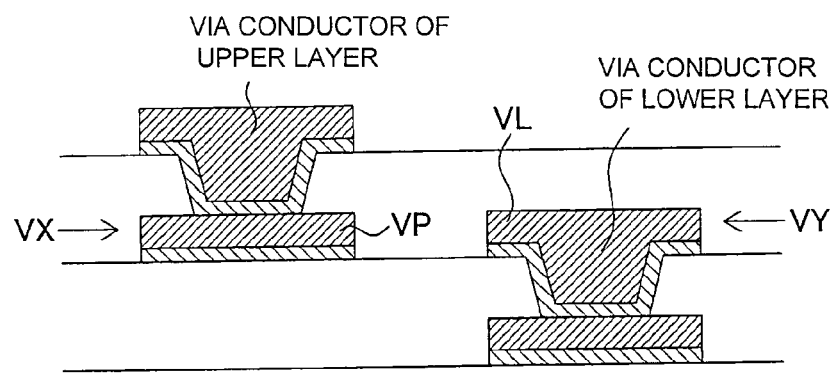

FIG. 21A illustrates first interlayer resin insulating layer (50G), second interlayer resin insulating layer (50E), ground layer (58CG) included in the conductive layer on the third interlayer resin insulating layer, high-speed signal connection line (first signal line) (58EH) interposed between the first interlayer resin insulating layer and the second interlayer resin insulating layer, and ground layer (58GG) on the first interlayer resin insulating layer. A high-speed signal line is interposed between ground layer (58CG) and ground layer (58GG), and a stripline is formed. In addition, first signal line (58EH) is surrounded by ground connection line (58EG) in conductive layer (58E) including the first signal line. Here, the thickness of high-speed signal connection line (58EH) is 15 µm, and the width is 28 µm. The high-speed signal connection line has characteristic impedance of 90Ω with respect to the high frequency of 6 GHz, and transmission loss is 1.5 dB or less. Similarly, a stripline is formed in the ground layer formed on the surface of the third interlayer resin insulating layer interposing the second signal line and the high-speed signal connection line (the second signal line) interposed between the third and fourth interlayer resin insulating layers and in the ground layer of the core substrate.

In the printed wiring board of the first embodiment, the number of interlayer resin insulating layers of the first buildup layer is four.

FIG. 21B illustrates a part of conductive layer (58E) on second interlayer resin insulating layer (50E). Conductive layer (58E) includes high-speed signal connection line (58EH) and low-speed signal connection line (58EL) illustrated in FIG. 21A. The width of the high-speed signal connection line is 28 µm, and a signal of approximately 6 GHz or higher is transmitted through the connection line. The width of the low-speed signal connection line is 14 µm, and a signal of approximately 100 MHz or lower is transmitted through the connection line.

The printed wiring board of the first embodiment has a wide high-speed signal connection line and a narrow low-speed signal connection line as connection lines for transmitting signals. Since the width of the high-speed signal connection line is large, resistance is low. Impedance is matched in a high-frequency area. In addition, the low-speed signal is transmitted through the narrow connection line. The printed wiring board is small. Since the transmission distance of the high-speed signal is short, high-speed signal transmission loss is small.

In the printed wiring board of the first embodiment, the thickness of the interlayer resin insulating layer of the first buildup layer is different from the thickness of the interlayer resin insulating layer of the second buildup layer. The thickness of the interlayer resin insulating layer of the first buildup layer is greater than the thickness of the interlayer resin insulating layer of the second buildup layer. The material of the interlayer resin insulating layer of the first buildup layer differs from the material of the interlayer resin insulating layer of the second buildup layer. The relative permittivity of the interlayer resin insulating layer of the first buildup layer is higher than the relative permittivity of the interlayer resin insulating layer of the second buildup layer. Regarding the interlayer resin insulating layer of the first buildup layer and the interlayer resin insulating layer of the second buildup layer, either their thickness or material or both have changed, and thus signals of multiple frequencies are transmitted in one printed wiring board with low loss. Multiple frequencies are, for example, frequencies of 1.0 GHz or higher and frequencies of 100 MHz or lower. Here, the first buildup layer has a high-speed signal connection line. The first buildup layer may have a low-speed signal connection line. Meanwhile, in the second buildup layer, a low-speed signal connection line is mainly formed.

When the high-speed signal connection line is formed in the second buildup layer, its length is 0.1 mm or shorter.

The first buildup layer is suitable to transmit high-speed signals, and the second buildup layer is suitable to transmit low-speed signals. In order to transmit high-speed signals, the thickness of the interlayer resin insulating layer of the first buildup layer is thick. Since the second buildup layer is suitable for transmission of low-speed signals, the thickness of the interlayer resin insulating layer of the second buildup layer is shallow. Attenuation of high-frequency signals is small. The thickness of the printed wiring board is shallow. In addition, the interlayer resin insulating layer of each layer of the first buildup layer is formed of a single material. The electric field is not easily thrown out of balance. Signal waveforms are not easily broken. Noise does not easily occur.

In the printed wiring board of the first embodiment, the relative permittivity of the interlayer resin insulating layer of the first buildup layer is 2.0 to 3.9, and is higher than the relative permittivity of the interlayer resin insulating layer of the second buildup layer. It is preferred that the relative permittivity of the interlayer resin insulating layer of the second buildup layer be 2.0 to 3.5. In addition, the thickness of the interlayer resin insulating layer of the first buildup layer is 30 µm to 200 µm, and is thicker than the thickness of the interlayer resin insulating layer of the second buildup layer. The thickness of the interlayer resin insulating layer of the second buildup layer is 10 µm to 30 µm. For this reason, the first buildup layer transmits high-frequency signals with low loss.

In the printed wiring board of the first embodiment, the dielectric tangent of the interlayer resin insulating layer of the first buildup layer is lower than the dielectric tangent of the interlayer resin insulating layer of the second buildup layer. The dielectric tangent of the interlayer resin insulating layer of the first buildup layer is 0.001 to 0.01, and the dielectric tangent of the interlayer resin insulating layer of the second buildup layer is 0.01 to 0.02. The first buildup layer can transmit high-frequency signals with low loss.

In the printed wiring board of the first embodiment, the interlayer resin insulating layers of first buildup layers (500F, 500S) have reinforcement members, and the interlayer resin insulating layers of second buildup layers (600F, 600S) have no reinforcement member. Since the thickness of the interlayer resin insulating layer of the first buildup layer is thicker than the thickness of the interlayer resin insulating layer of the second buildup layer, and the interlayer resin insulating layer of the first buildup layer has the reinforcement member, the upper surface of the interlayer resin insulating layer of the first buildup layer is easy to make flat. For this reason, it is easy to control the width and thickness of the high-speed signal connection line. Matching of impedance is easy. In addition, since the interlayer resin insulating layer of the first buildup layer has a core member, bending of the printed wiring board is reduced. High-speed signal transmission loss is reduced.

In the printed wiring board of the first embodiment, the thickness of the conductive layer interposed between the first interlayer resin insulating layer and the second interlayer resin insulating layer of the first buildup layer, and the thickness of the conductive layer interposed between the third interlayer resin insulating layer and the fourth interlayer resin insulating layer of the first buildup layer, are thicker than the thickness of the conductive layer of the second buildup layer. The thickness of the conductive layer formed on the same layer as the high-speed signal connection line is thicker than the thickness of the conductive layer of the second buildup layer. The other thicknesses of the conductive layers of the first buildup layers may be shallower than the thickness of the high-speed signal connection line similar to the conductive layer of the second buildup layer. The printed wiring board becomes thin. The thickness of the high-speed signal connection line of the first buildup layer is thicker than the thickness of the ground layer of the first buildup layer, the thickness of the ground layer of the first buildup layer is at least as thick as the thickness of the conductive layer of the second buildup layer, and high-speed signals are transmitted with low loss. The thickness of the printed wiring board is reduced.

Resistance of the high-speed signal connection line is lowered. Impedance is easily matched in a high-frequency area.

Figure 29:
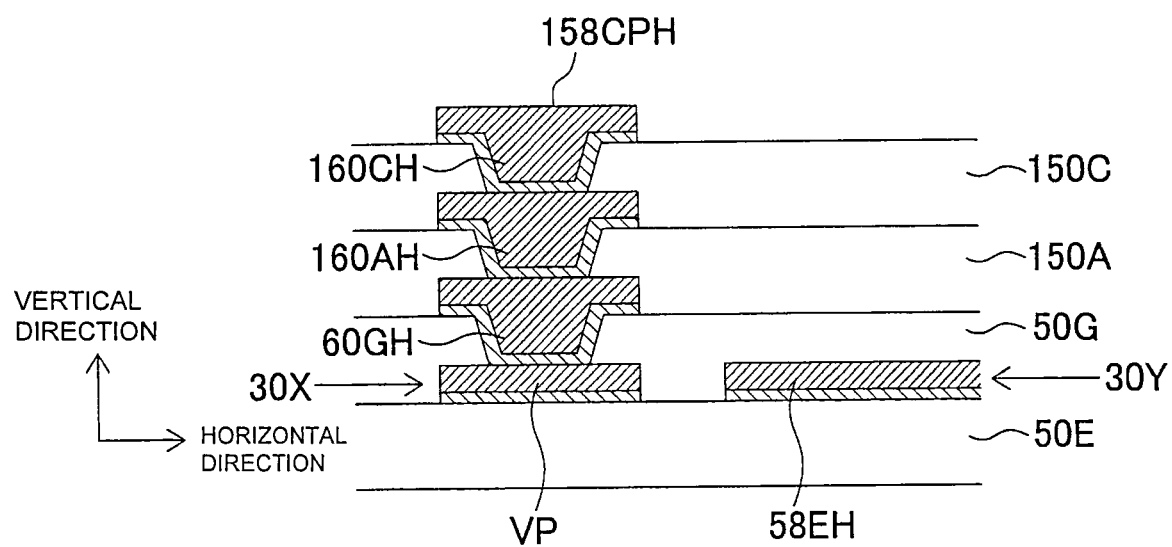
FIG. 29 is a cross-sectional view illustrating part of the printed wiring board of the first embodiment.

FIG. 29 illustrates a part of a cross section of the printed wiring board of the first embodiment. In this example, upper high-speed signal pad (158CPH) and first signal line (58EH) are not connected through the stacked via. A bypass connection line (WU) is formed between first signal line (58EH) and via pad (VP) of high-speed signal via conductor (60GH) of the first interlayer resin insulating layer (FIGS. 27A and 27B). The same bypass connection line as the bypass connection line illustrated in FIGS. 27A and 27B is formed between 30X and 30Y of FIG. 29. When high-speed signals are transmitted from the via conductor to the high-speed signal connection line, the impedance is changed by reflection or the like. By forming the bypass connection line, the impedance is matched. Even when the frequency of a high-speed signal is 6 GHz or higher, the impedance of the high-speed signal connection line is matched to 90Ω.

The shape of the bypass connection line is a U shape or an arc shape.

When the bypass connection line is formed in the same layer as the ground layer interposing the high-speed signal connection line, the thicknesses of the bypass connection line and the ground layer are substantially the same as that of the high-speed signal connection line.

In the printed wiring board of the first embodiment, in order to match characteristic impedance, the bypass connection line is formed between the via conductor for transmitting high-speed signals and the high-speed signal connection line. When a high-speed signal is transmitted in a cross-sectional direction of the printed wiring board through the via conductor and then is transmitted in a direction horizontal to the printed wiring board through the high-speed signal connection line, the bypass connection line is formed between the via conductor and the high-speed signal connection line to match the impedance. The path having the bypass connection line is suitable to be the path for transmitting high-frequency signals.

FIG. 22B illustrates part of conductive layer (lowermost conductive layer) (158D) on the lowermost interlayer resin insulating layer. A circular conductor pattern on the left side of the drawing is BGA pad (PBH) for connection to the main board, and solder bump (76D) is formed on pad (PBH). Since the solder bump and the conductive layer are different in material, impedance is reduced. For this reason, bypass connection line (WU) is formed between BGA pad (PBH) and high-speed signal via conductor (160DH) formed in the lowermost interlayer resin insulating layer. The conductor around via conductor (160DH) is a land (160DVL) of via conductor (160DH). Accordingly, the impedance is kept at 90Ω with respect to a high-frequency signal of, for example, 6 GHz. A cross section related to FIG. 22B is illustrated in FIG. 28C.

In the printed wiring board of the first embodiment, the bypass connection line for adjusting characteristic impedance is formed between the BGA pad connected to the main board and via conductor (160DH) of the lowermost interlayer resin insulating layer. For this reason, a decrease in impedance in the solder bump is suppressed.

Bypass connection line (WU) may be formed between land (VL) of the via conductor and receiving pad (VP), which are adjacent up and down (FIGS. 23A and 23B). The characteristic impedance is raised by the bypass connection line. It is preferred that the shape of the bypass connection line be a coil shape, a U shape, an arc shape, an L shape or a rectangular shape. FIGS. 23A and 23B illustrate examples of the bypass connection line. FIG. 23C is a cross-sectional view. FIGS. 23A and 23B are plan views between VX and VY of FIG. 23C.

A method of manufacturing printed wiring board 10 of the first embodiment is illustrated in FIGS. 3A to 10B.

(1) An insulating base (30z) and a double-sided copper-clad lamination plate (30Z) on which copper foils 22 are laminated on both surfaces are starting materials. The thickness of the insulating base is 600 μm. The insulating base has a first surface (F) and a second surface (S) opposite the first surface. A blackening process (not illustrated) is performed on a surface of the copper foil 22 (FIG. 3A).

(2) The insulating base (30z) is irradiated with a laser, and a through-hole 31 for a through-hole conductor is formed (FIG. 3B).

(3) An electroless plating film 24 is formed on an inner wall of through-hole 31 and copper foil 22 by an electroless plating process (FIG. 3C).

(4) A plating resist 26 is formed on electroless plating film 24 (FIG. 3D).

(5) By an electrolytic plating process, an electrolytic plating film 28 is formed on the electroless plating film exposed from the plating resist. A through-hole conductor 36 is formed in the through hole. Through-hole conductor 36 is formed of electroless plating film 24 formed on the inner wall of the through hole and electrolytic plating film 28 filling the through hole (FIG. 3E).

(6) The plating resist is peeled off, electroless plating film 24 and copper foil 22 between the electrolytic plating films are removed, and conductive layers (34A, 34B) are formed (FIG. 4A). Conductive layer (34A) includes a ground layer. Thicknesses of conductive layers (34A, 34B) are 15 μm. A core substrate is completed.

(7) B-stage prepreg is laminated on core substrate 30. The prepreg includes glass cloth, resin and inorganic particles such as glass particles. The prepreg of the first surface and the second surface of the core substrate is cured. Fourth interlayer resin insulating layers (50A, 50B) of the first layers of the upper and lower first buildup layers are formed on the first surface and the second surface of the core substrate (FIG. 4B). Thicknesses of fourth interlayer resin insulating layers (50A, 50B) are 60 μm. As illustrated in FIGS. 21A and 21B, the thickness of the interlayer resin insulating layer is the distance from the upper surface of the conductive layer to the upper surface of the interlayer resin insulating layer. The thickness of the interlayer resin insulating layer is a distance (IL) between the conductive layers (FIGS. 21A and 21B).

(8) Via-conductor openings (51A, 51B) reaching conductive layers (34A, 34B) and through-hole conductor 36 are formed on fourth interlayer resin insulating layers (50A, 50B) (FIG. 4C). Rough surfaces are formed on fourth interlayer resin insulating layers (50A, 50B) (not illustrated).

(9) Using an electroless plating process, an electroless plating film 52 is formed on the inner wall of the via-conductor opening and the fourth interlayer resin insulating layer (FIG. 4D).

(10) A plating resist 54 is formed on electroless plating film 52 (FIG. 5A).

(11) Using an electrolytic plating process, an electrolytic plating film 56 is formed on electroless plating film 52 exposed from the plating resist (FIG. 5B).

(12) Plating resist 54 is removed. Thereafter, electroless plating film 52 exposed from the electrolytic copper plating film is removed, and conductive layers (58A, 58B) formed of electroless plating film 52 and electrolytic plating film 56 are formed. Conductive layers (58A, 58B) include multiple conductor circuits and a land of via conductor (FIG. 5C). Thicknesses of conductive layers (58A, 58B) are 15 μm. Conductive layer (58A) includes a high-speed signal connection line (the second signal line) and a low-speed signal connection line. The surfaces of the conductive layers (58A, 58B) are roughened (not illustrated).

(13) The processes of FIGS. 4B to 5C are repeated. Third interlayer resin insulating layers (50C, 50D) of the second layers are formed on fourth interlayer resin insulating layers (50A, 50B) and conductive layers (58A, 58B). Conductive layers (58C, 58D) are formed on third interlayer resin insulating layers (50C, 50D). Conductive layer (58C) includes a ground layer and a land of the via conductor. Conductive layers (58C, 58D) and conductive layers (58A, 58B) are connected to via conductors (60C, 60D) formed in third interlayer resin insulating layers (50C, 50D).

Second interlayer resin insulating layers (50E, 50F) of the third layers are formed on third interlayer resin insulating layers (50C, 50D) and conductive layers (58C, 58D). Conductive layers (58E, 58F) are formed on second interlayer resin insulating layers (50E, 50F). Conductive layer (58E) includes the high-speed signal connection line (the first signal line) and the low-speed signal connection line (the third signal line). Conductive layers (58C, 58D) and conductive layers (58E, 58F) are connected to via conductors (60E, 60F) formed in second interlayer resin insulating layers (50E, 50F).

First interlayer resin insulating layers (50G, 50H) of the fourth layers are formed on second interlayer resin insulating layers (50E, 50F) and conductive layers (58E, 58F). Conductive layers (58G, 58H) are formed on first interlayer resin insulating layers (50G, 50H). Conductive layer (58G) includes a ground layer and a land of the via conductor. Conductive layers (58G, 58H) and conductive layers (58E, 58F) are connected to via conductors (60G, 60H) formed in first interlayer resin insulating layers (50G, 50H).

Upper first buildup layer (500F) is formed on the first surface of the core substrate, and lower first buildup layer (500S) is formed on the second surface of the core substrate (FIG. 6A). The thicknesses of the interlayer resin insulating layers belonging to the upper and lower first buildup layers are the same. In the first embodiment, the thickness of the interlayer resin insulating layer is 60 µm. The thicknesses of the conductive layers belonging to the upper and lower first buildup layers are the same. In the first embodiment, the thickness of the conductive layer is 15 µm.

(14) An interlayer resin insulating layer resin film is laminated on upper and lower first buildup layers (500F, 500S). The interlayer resin insulating layer resin film has no reinforcement member. The interlayer resin insulating layer resin film is cured. Interlayer resin insulating layers (150A, 150B) of the upper and lower second buildup layers are formed on upper and lower first buildup layers (500F, 500S) (FIG. 6B). Interlayer resin insulating layer (150A) is the upper interlayer resin insulating layer, and interlayer resin insulating layer (150B) is the lower interlayer resin insulating layer. Each thickness of interlayer resin insulating layers (150A, 150B) is 30 µm.

(15) Via-conductor openings (151A, 151B) are formed in interlayer resin insulating layers (150A, 150B) (FIG. 7A). Rough surfaces are formed on interlayer resin insulating layers (150A, 150B) (not illustrated).

(16) Using an electroless plating process, an electroless copper plating film 152 is formed on the inner wall of the via-conductor opening and the interlayer resin insulating layer (FIG. 7B).

(17) A plating resist 154 is formed on electroless copper plating film 152 (FIG. 8A).

(18) Using an electrolytic plating process, an electrolytic plating film 156 is formed on electroless copper plating film 152 exposed from the plating resist (FIG. 8B).

(19) Plating resist 154 is removed by 5% NaOH. Thereafter, electroless copper plating film 152 exposed from the electrolytic copper plating film is removed by etching, and conductive layers (158A, 158B) formed of electroless copper plating film 152 and electrolytic plating film 156 are formed (FIG. 9A). The surfaces of conductive layers (158A, 158B) are roughened (not illustrated).

(20) The processes of FIG. 6B to FIG. 9A are repeated, and uppermost and lowermost interlayer resin insulating layers (150C, 150D) are formed on interlayer resin insulating layers (150A, 150B) and conductive layers (158A, 158B). The uppermost interlayer resin insulating layer belongs to upper second buildup layer (600F), and the lowermost interlayer resin insulating layer belongs to lower second buildup layer (600S). Conductive layers (158C, 158D) are formed on the uppermost and lowermost interlayer resin insulating layers. Conductive layers (158C, 158D) and conductive layers (158A, 158B) are connected to uppermost and lowermost via conductors (160C, 160D) formed in the uppermost and lowermost interlayer resin insulating layers (FIG. 9B). The thicknesses of the interlayer resin insulating layers and the conductive layers belonging to the upper and lower second buildup layers are the same. The thickness of the interlayer resin insulating layer is 30 µm, and the thickness of the conductive layer is 13 µm.

(17) Solder mask layers (70A, 70B) having openings (71A, 71B) are formed on the upper and lower second buildup layers (FIG. 10A). Openings (71A, 71B) expose the upper surfaces of the conductive layer and the via conductors. Their portions serve as pads.

(18) A metal film 72 formed of a nickel layer and a gold layer on the nickel layer is formed on the pad (FIG. 10B). In addition to the nickel-gold layer, a metal film formed of a nickel-palladium-gold layer may be used.

(19) Thereafter, a solder bump (76U) is formed on the pad of the upper buildup layer, and a solder bump (76D) is formed on the pad of the lower buildup layer. Printed wiring board 10 having the solder bump is completed (FIG. 1).

An IC chip is mounted on printed wiring board 10 through solder bump (76U) (not illustrated). Thereafter, the printed wiring board is mounted on the main board through solder bump (76D). An IC chip is mounted on the upper buildup layer.

Second Embodiment

Figure 11:
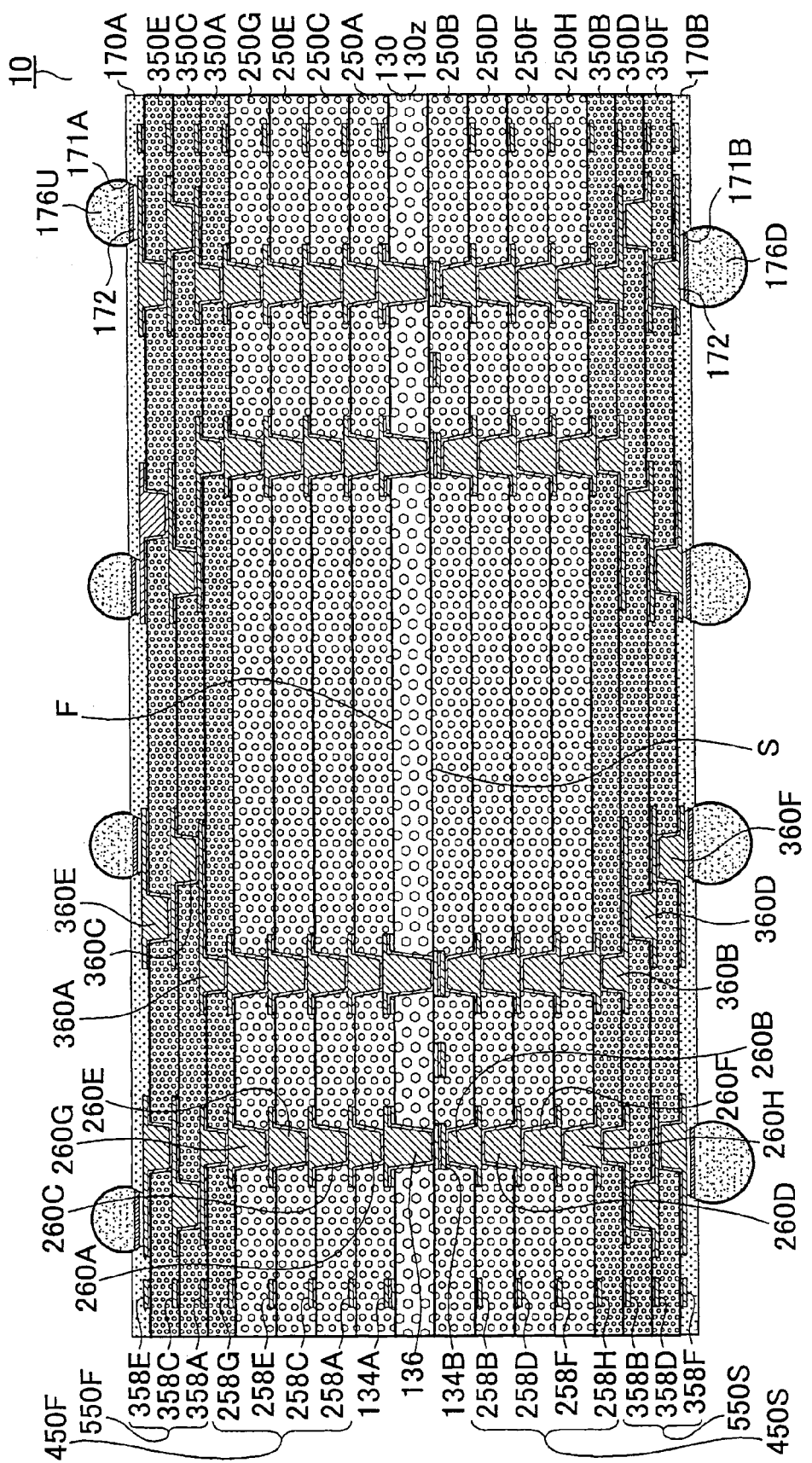
FIG. 11 is a cross-sectional view of a printed wiring board according to a second embodiment of the invention.

FIG. 11 illustrates a cross section of printed wiring board 10 according to a second embodiment of the invention. Printed wiring board 10 has a core substrate 130 including an insulating base 130z having a first surface (F) and a second surface (S) opposite the first surface, a conductive layer (134A) of the first surface of the insulating base 130z, a conductive layer (134B) of the second surface of the insulating base (130z), and a via conductor 136 connecting conductive layer (134A) to conductive layer (134B). Conductive layer (134A) has a ground layer.

The first surface of the core substrate and the first surface of the insulating base are the same surface, and the second surface of the core substrate and the second surface of the insulating base are the same surface. An upper first buildup layer (450F) is formed on first surface (F) of core substrate 30. Upper first buildup layer (450F) has four interlayer resin insulating layers (250A, 250C, 250E, 250G) formed on first surface (F) of core substrate 130. The upper first buildup layer of the second embodiment is the same as the upper first buildup layer of the first embodiment.

A conductive layer (258A) is formed on fourth interlayer resin insulating layer (250A) of the first layer. Conductive layer (258A) has a signal line transmitting a high-speed signal. Conductive layer (258A) may have a signal line transmitting a low-speed signal. A via conductor (260A) passing through the fourth interlayer resin insulating layer and connecting conductive layer (258A) to conductive layer (134A) is formed in fourth interlayer resin insulating layer (250A). Third interlayer resin insulating layer (250C) of the second layer is formed on fourth interlayer resin insulating layer (250A) and conductive layer (258A). A conductive layer (258C) is formed on the third interlayer resin insulating layer. Conductive layer (258C) has a ground layer. A via conductor (260C) passing through the third interlayer resin insulating layer and connecting conductive layer (258C) to conductive layer (258A) is formed in the third interlayer resin insulating layer. Second interlayer resin insulating layer (250E) of the third layer is formed on third interlayer resin insulating layer (250C) and conductive layer (258C). Conductive layer (258E) is formed on the second interlayer resin insulating layer. A via conductor (260E) passing through the second interlayer resin insulating layer and connecting conductive layer (258E) to conductive layer (258C) is formed in the second interlayer resin insulating layer. Conductive layer (258E) has a signal line transmitting a high-speed signal. Conductive layer (258E) may have a signal line transmitting a low-speed signal. First interlayer resin insulating layer (250G) of the fourth layer is formed on second interlayer resin insulating layer (250E) and conductive layer (258E). A conductive layer (258G) is formed on the first interlayer resin insulating layer. Conductive layer (258G) includes a ground layer. A via conductor (260G) passing through the first interlayer resin insulating layer and connecting conductive layer (258G) and conductive layer (258E) is formed in the first interlayer resin insulating layer. A high-speed signal line in conductive layer (258A) is interposed between the ground layer of the core substrate and the ground layer on the third interlayer resin insulating layer. The high-speed signal line in conductive layer (258E) is interposed between the ground layer on the third interlayer resin insulating layer and the ground layer on the first interlayer resin insulating layer.

On first interlayer resin insulating layer (250G) of upper first buildup layer (450F), a third interlayer resin insulating layer (350A) of the first layer of the upper second buildup layer is formed. A conductive layer (358A) is formed on interlayer resin insulating layer (350A). A via conductor (360A) passing through third interlayer resin insulating layer (350A) and connecting conductive layer (358A) to conductive layer (258G) is formed in third interlayer resin insulating layer (350A). A second interlayer resin insulating layer (350C) of the second layer of the upper second buildup layer is formed on third interlayer resin insulating layer (350A). A conductive layer (358C) is formed on interlayer resin insulating layer (350C). A via conductor (360C) passing through second interlayer resin insulating layer (350C) and connecting conductive layer (358C) to conductive layer (358A) is formed in second interlayer resin insulating layer (350C). A first interlayer resin insulating layer (350E) of the third layer is formed on second interlayer resin insulating layer (350C). A conductive layer (the uppermost conductive layer) (358E) is formed on first interlayer resin insulating layer (350E). A via conductor (360E) passing through first interlayer resin insulating layer (350E) and connecting conductive layer (358E) to conductive layer (358C) is formed in first interlayer resin insulating layer (350E).

The same buildup layer (lower first buildup layer) (450S) as upper first buildup layer (450F) is formed on second surface (S) of core substrate 130. The same buildup layer (lower second buildup layer) (550S) as upper second buildup layer (550F) is formed on the lower first buildup layer.

The thickness of each conductive layer of the core substrate and the thickness of each conductive layer belonging to the upper and lower first buildup layers are the same, which is 35 μm. The thickness of each interlayer resin insulating layer belonging to the upper and lower first buildup layers is 45 μm.

The thickness of each conductive layer belonging to the upper and lower second buildup layers is 15 μm. The thickness of each interlayer resin insulating layer belonging to the upper and lower second buildup layers is 30 μm.

An upper buildup layer is formed of the upper first buildup layer and the upper second buildup layer, and a lower buildup layer is formed of the lower first buildup layer and the lower second buildup layer.

A solder mask layer (an upper solder mask layer) (170A) having an opening (171A) is formed on the upper buildup layer. A solder mask layer (a lower solder mask layer) (170B) having an opening (171B) is formed on the lower buildup layer. Conductive layers (358E, 358F) and the upper surfaces of via conductors (360E, 360F) exposed by the openings of the solder mask layer serve as pads. A metal film 172 such as Ni/Pd/Au is formed on the pad, and solder bumps (176U, 176D) are formed on the metal film.

The thickness of the core substrate of the printed wiring board of the second embodiment is shallower than the thickness of the core substrate of the first embodiment.

Figure 12:
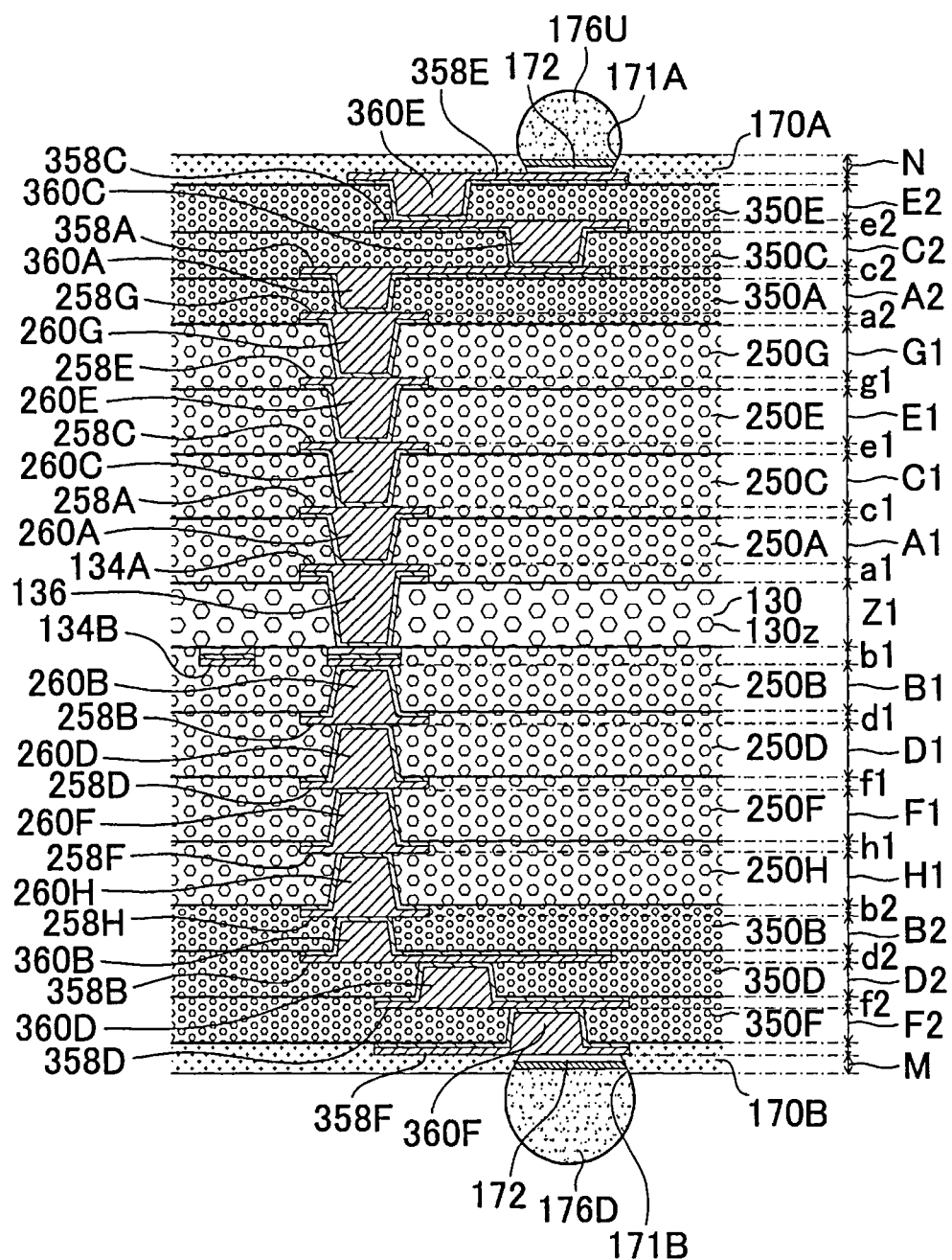
FIG. 12 is a cross-sectional view illustrating part of the printed wiring board of the second embodiment.
Figure 13:
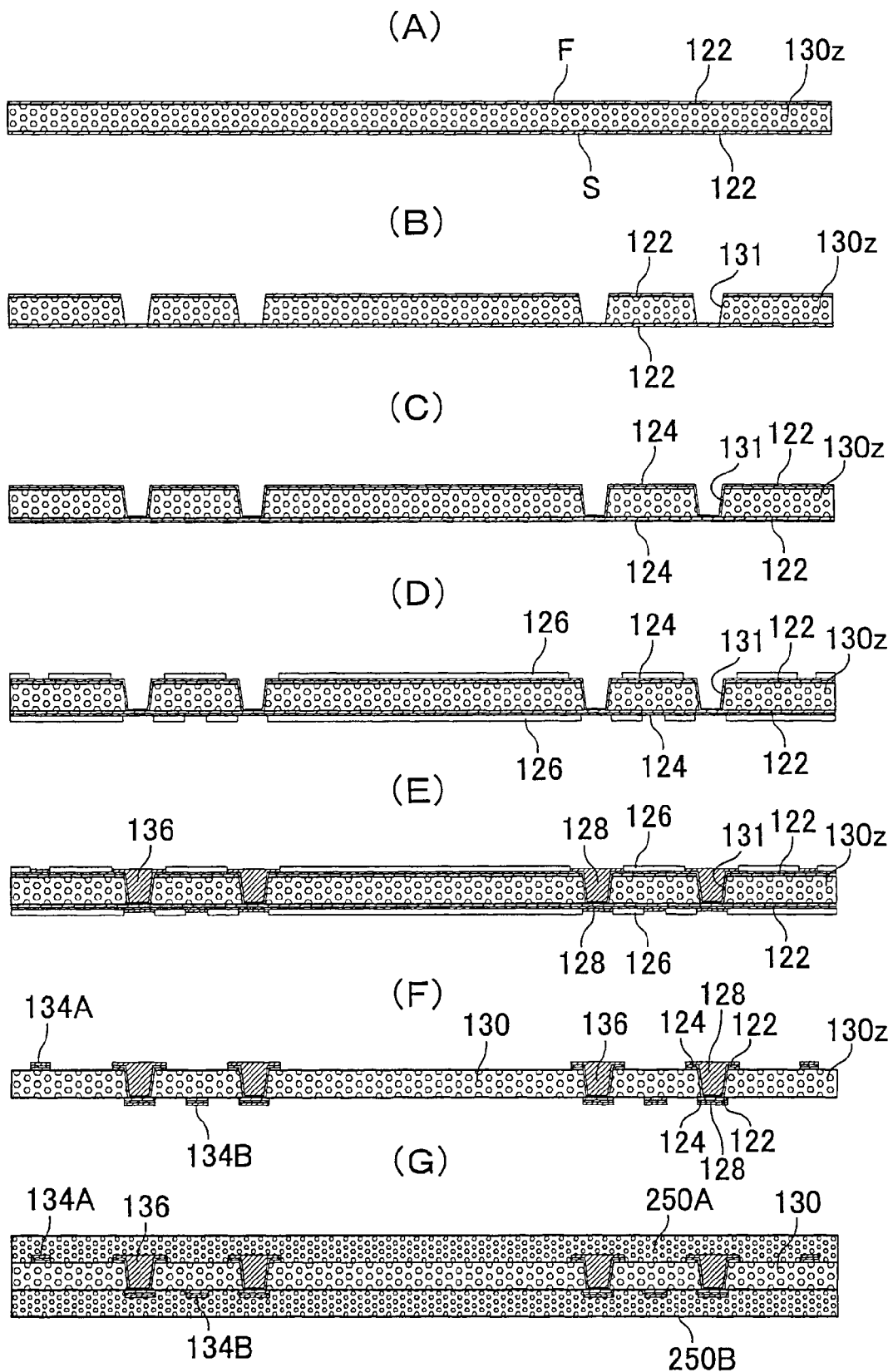
FIGS. 13A to 13G are process diagrams illustrating a method of manufacturing the printed wiring board of the second embodiment.
Figure 14:
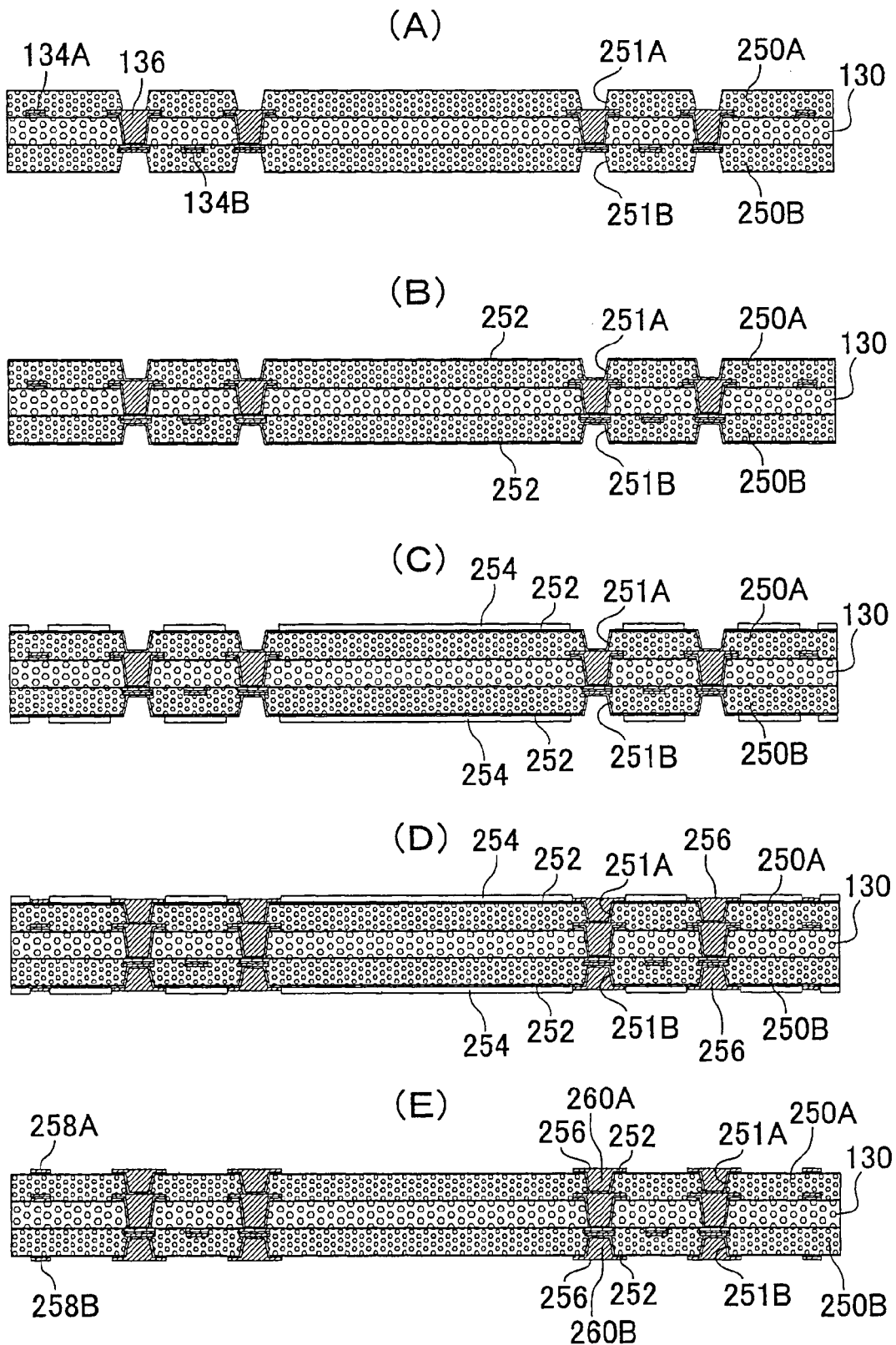
FIGS. 14A to 14E are process diagrams illustrating a method of manufacturing the printed wiring board of the second embodiment.
Figure 15:
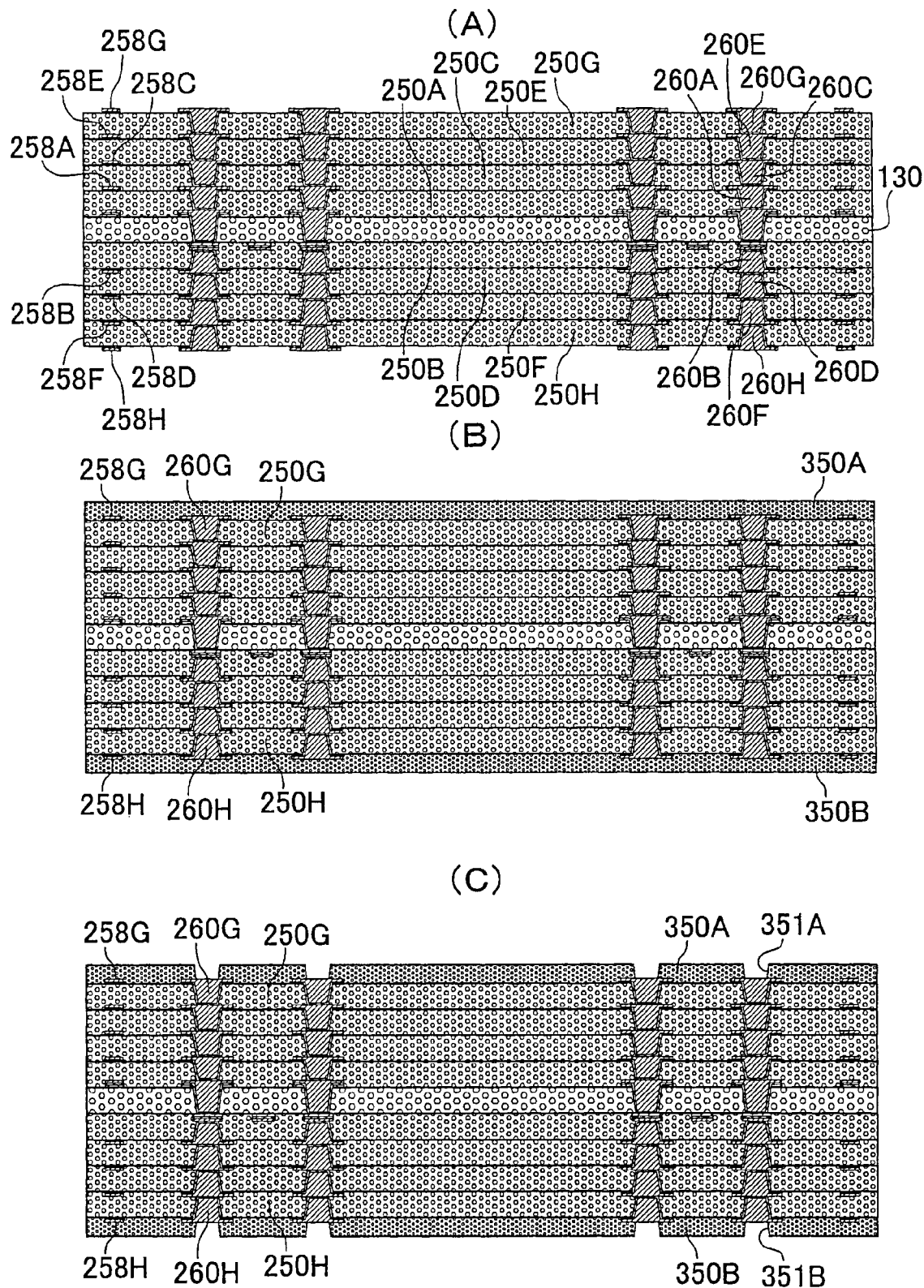
FIGS. 15A to 15C are process diagrams illustrating a method of manufacturing the printed wiring board of the second embodiment.
Figure 16:
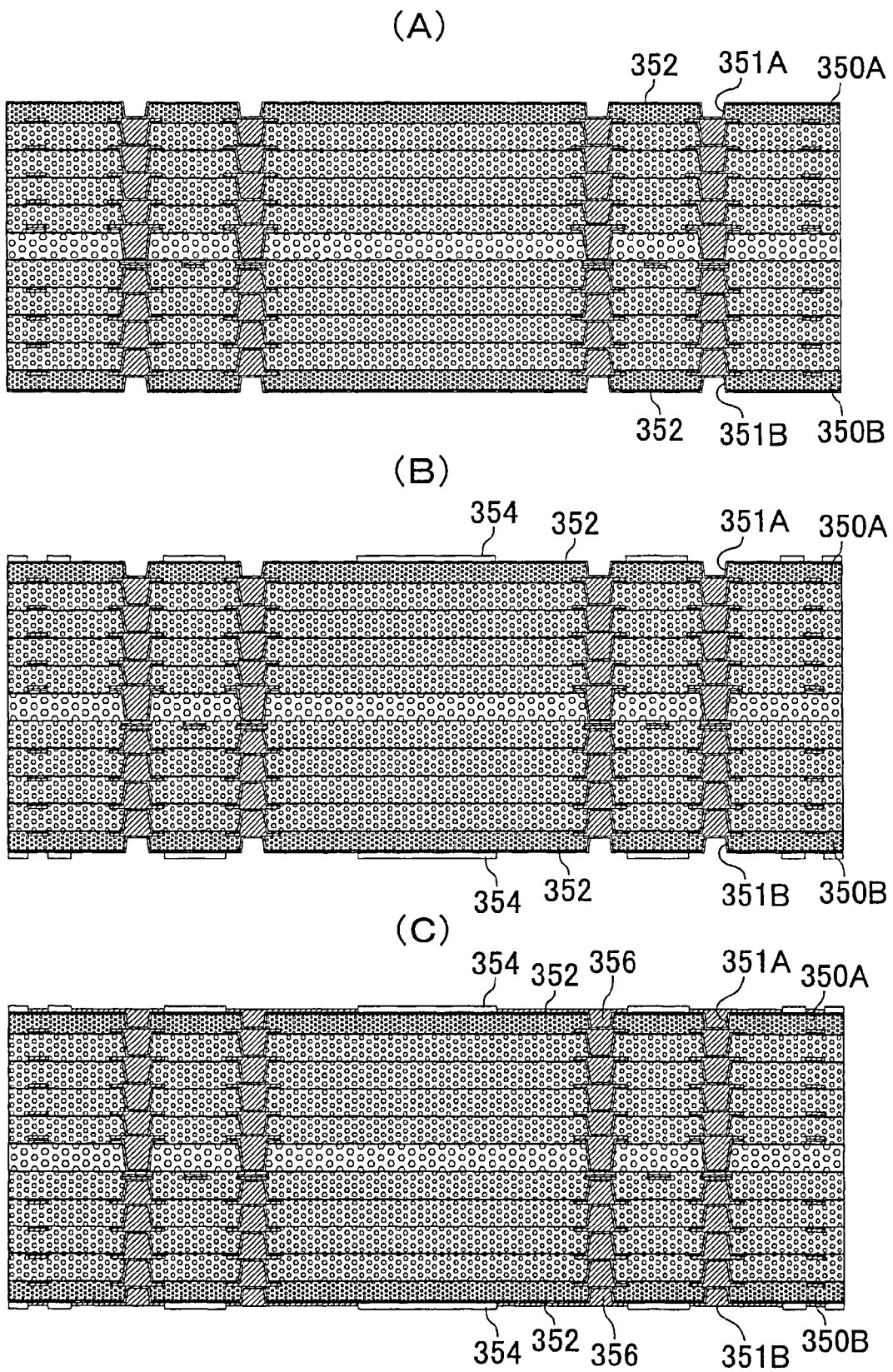
FIGS. 16A to 16C are process diagrams illustrating a method of manufacturing the printed wiring board of the second embodiment.
Figure 17:
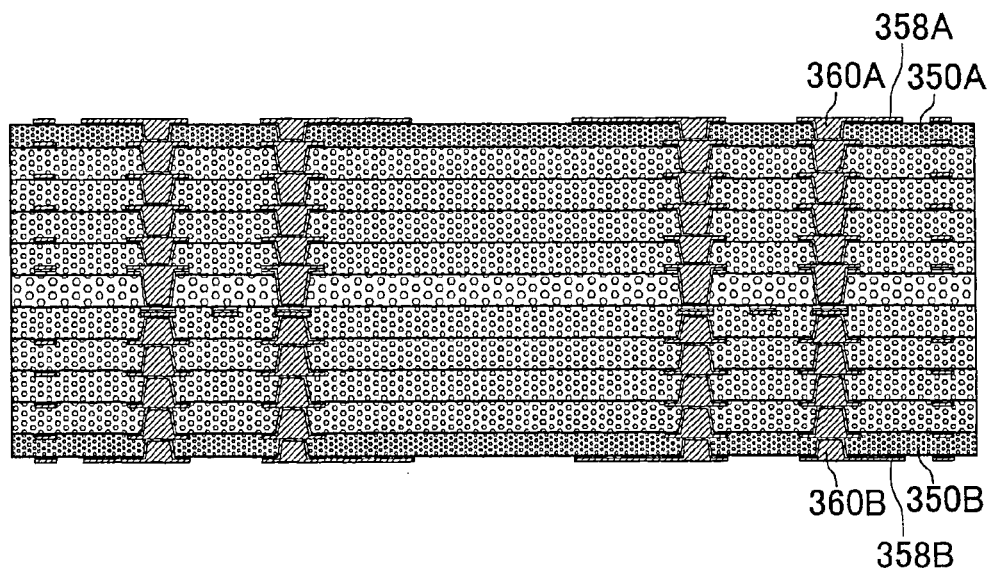
FIGS. 17A and 17B are process diagrams illustrating a method of manufacturing the printed wiring board of the second embodiment.
Figure 17:
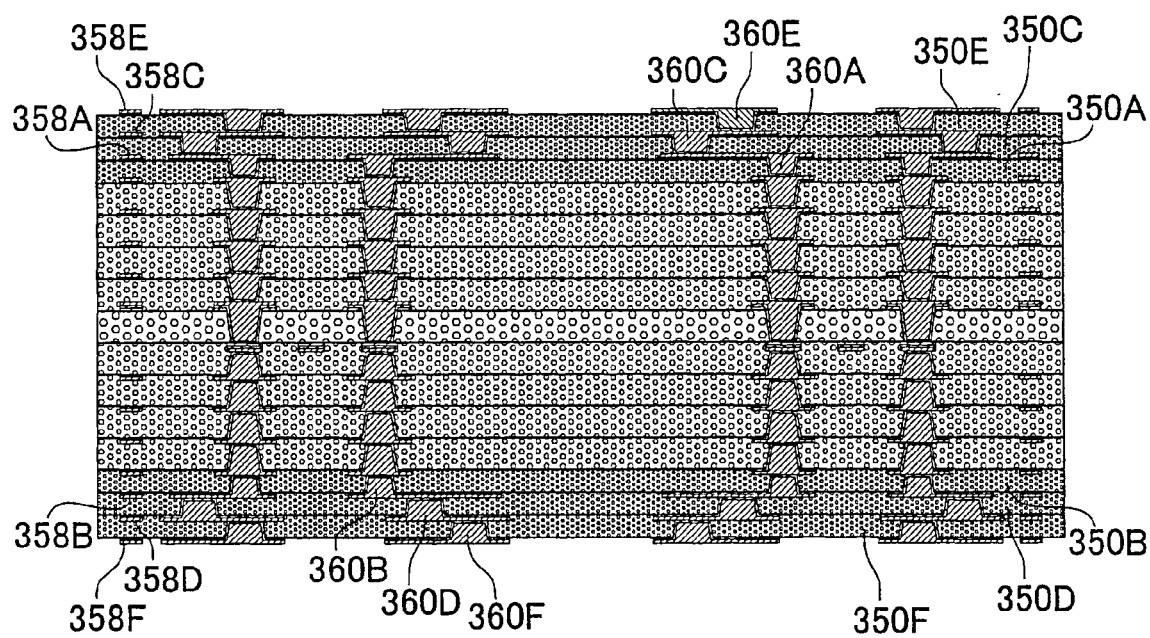
Figure 18:
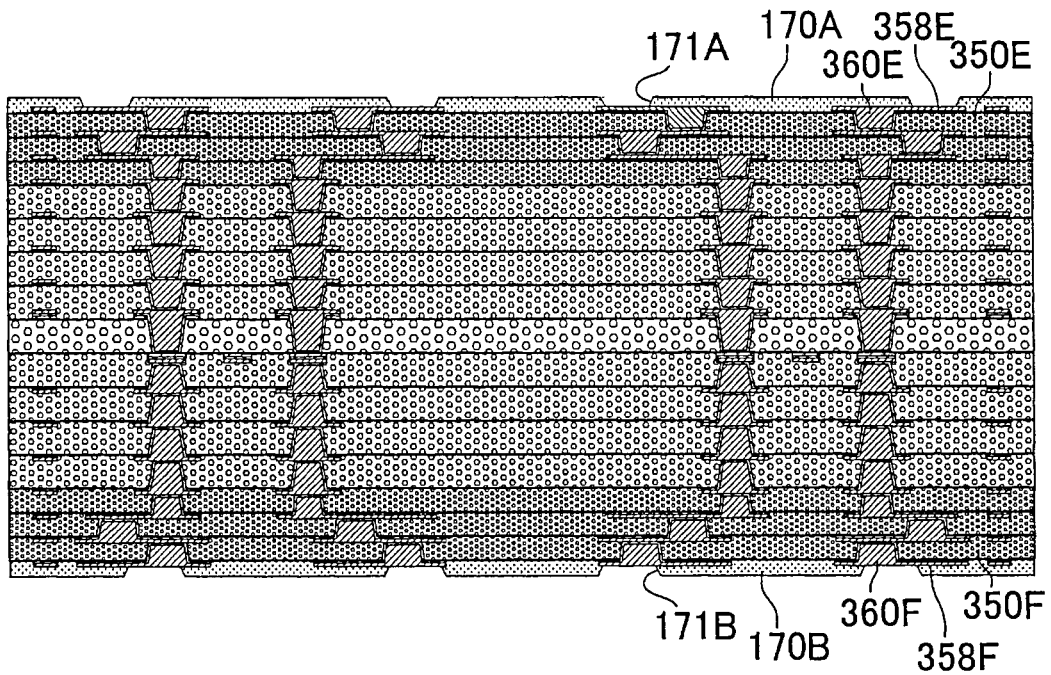
FIGS. 18A and 18B are process diagrams illustrating a method of manufacturing the printed wiring board of the second embodiment.
Figure 18:
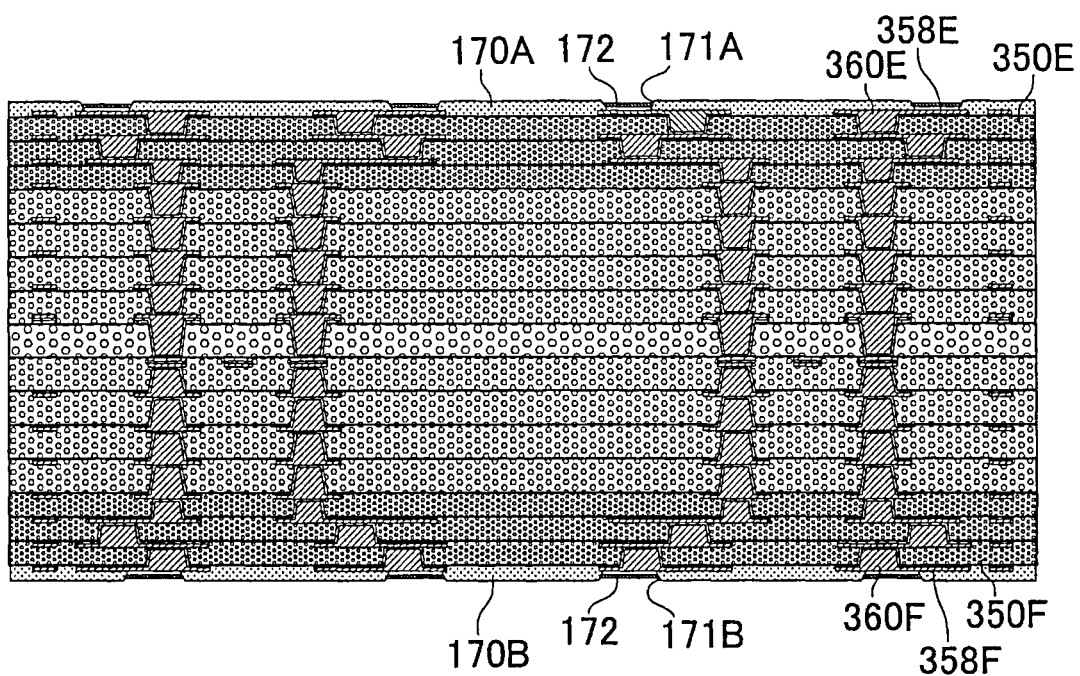

FIG. 12 enlarges and illustrates part of the printed wiring board of FIG. 11.

The insulating base (130z) constituting the core substrate has a reinforcement member such as glass cloth. The relative permittivity of the insulating base is 3.9, and the dielectric tangent is 0.009. A thickness (Z1) of insulating base (30z) is 60 μm. A thickness (a1) of conductive layer (134A) of the first surface of insulating base (130z) and a thickness (b1) of conductive layer (134B) of the second surface are each 35 μm.

The thickness of each interlayer resin insulating layer of the upper and lower first buildup layers is 45 μm. The thickness of each conductive layer of the upper and lower first buildup layers is 35 μm. The interlayer resin insulating layers (250A, 250C, 250E, 250G, 250B, 250D, 250F, 250H) of the upper and lower first buildup layers include a reinforcement member such as glass cloth and inorganic particles such as silica.

The thickness of each interlayer resin insulating layer of the upper and lower second buildup layers is 30 μm. The thickness of each conductive layer of the upper and lower second buildup layers is 15 μm. The thicknesses of the upper and lower solder mask layers are each 21 μm. The thickness of the interlayer resin insulating layer to be measured is illustrated in FIGS. 21A and 21B. The interlayer resin insulating layers (350A, 350C, 350E, 350B, 350D, 350F) of the upper and lower second buildup layers include inorganic particles such as silica, but do not include reinforcement members such as glass cloth.

The relative permittivity of the interlayer resin insulating layers of the upper and lower first buildup layers is 3.9, and the dielectric tangent is 0.009. The relative permittivity of the interlayer resin insulating layers of the upper and lower second buildup layers is 3.1, and the dielectric tangent is 0.019. The relative permittivity of upper and lower solder mask layers (70A, 70B) is 3.55, and the dielectric tangent is 0.024.

The printed wiring board of the second embodiment is suitable for high-speed signal transmission since the core substrate is thin. The printed wiring board of the second embodiment is provided with the same bypass connection line as that of the first embodiment. In addition, in the second embodiment and the first embodiment, the same buildup layer is provided, and thus the printed wiring board of the second embodiment has the same effect as that of the first embodiment.

A method of manufacturing printed wiring board 10 of the second embodiment is illustrated in FIGS. 13A to 18B.

(1) An insulating base (130z) and a double-sided copper-clad lamination plate (130Z) on which copper foils 122 are laminated on both surfaces are starting materials. The thickness of the insulating base is 60 μm. The insulating base has a first surface (F) and a second surface (S) opposite the first surface. A blackening process (not illustrated) is performed on a surface of copper foil 122 (FIG. 13A).

(2) The insulating base (130z) is irradiated with a laser, and a via-conductor opening 131 is formed (FIG. 13B). In the second embodiment, opening 131 formed in the starting material is a non-through-hole.

(3) An electroless plating film 124 is formed on an inner wall of opening 131 and copper foil 122 by an electroless plating process (FIG. 13C).

(4) A plating resist 126 is formed on electroless plating film 124 (FIG. 13D).

(5) Using an electrolytic plating process, an electrolytic plating film 128 is formed on the electroless plating film exposed from the plating resist. A via conductor 136 is formed in the opening. Via conductor 136 is formed of electroless plating film 124 formed on the inner wall of the through-hole and electrolytic plating film 128 filling the opening (FIG. 13E).

(6) The plating resist is removed, and electroless plating film 124 between the electrolytic plating films is removed. Conductive layers (134A, 134B) are formed (FIG. 13F). Core substrate 130 of the second embodiment is completed. The core substrate of the printed wiring board of the first embodiment may be replaced with the core substrate of the second embodiment.

(7) B-stage prepreg is laminated on core substrate 130. The prepreg includes glass cloth, resin and inorganic particles. The prepreg of the first surface and the second surface of the core substrate is cured. Fourth interlayer resin insulating layers (250A, 250B) of the first layer are formed on the first surface and the second surface of the core substrate (FIG. 13G).

(8) Via-conductor openings (251A, 251B) reaching the conductive layers (134A, 134B) and via conductor 136 are formed on fourth interlayer resin insulating layers (250A, 250B) (FIG. 14A). Rough surfaces are formed on fourth interlayer resin insulating layers (250A, 250B) (not illustrated).

(9) Using an electroless plating process, an electroless copper plating film 252 is formed on the inner wall of the via-conductor opening and fourth interlayer resin insulating layers (250A, 250B) (FIG. 14B).

(10) A plating resist 254 is formed on electroless copper plating film 252 (FIG. 14C).

(11) Using an electrolytic plating process, an electrolytic plating film 256 is formed on electroless copper plating film 252 exposed from the plating resist (FIG. 14D).

(12) Plating resist 254 is removed by 5% NaOH. Thereafter, electroless copper plating film 252 exposed from the electrolytic copper plating film is removed by etching, conductive layers (258A, 258B) formed of electroless copper plating film 252 and electrolytic plating film 256 are formed (FIG. 14E). The surfaces of conductive layers (258A, 258B) and via conductors (260A, 260B) are roughened (not illustrated).

(13) The processes similar to those of FIGS. 13G to 14E are repeatedly performed, and the upper and lower first buildup layers are formed on both surfaces of the core substrate (FIG. 15A).

(14) An interlayer insulating layer resin film is laminated on the upper and lower first buildup layers. The interlayer resin insulating layer resin film has no reinforcement member. The interlayer resin insulating layer resin film is cured, and third interlayer resin insulating layers (350A, 350B) of the second buildup layer are formed (FIG. 15B).

(15) Via-conductor openings (351A, 351B) are formed in third interlayer resin insulating layers (350A, 350B) of the upper and lower second buildup layers (FIG. 15C). Rough surfaces are formed on third interlayer resin insulating layers (350A, 350B) (not illustrated).

(16) Using an electroless plating process, an electroless copper plating film 352 is formed on the inner wall of the via-conductor opening and the third interlayer resin insulating layer (FIG. 16A).

(17) A plating resist 354 is formed on electroless copper plating film 152 (FIG. 16A).

(18) Using an electrolytic plating process, an electrolytic plating film 356 is formed on electroless copper plating film 352 exposed from the plating resist (FIG. 16C).

(19) Plating resist 354 is removed by 5% NaOH. Thereafter, electroless copper plating film 352 exposed from the electrolytic copper plating film is removed by etching, and conductive layers (358A, 358B) formed of the electroless copper plating film 352 and electrolytic plating film 356 are formed (FIG. 17A). The surfaces of conductive layers (358A, 358B) are roughened (not illustrated).

(20) The processes similar to those of FIGS. 15B to 17A are repeatedly performed, and the upper and lower second buildup layers are formed on the upper and lower first buildup layers. The upper and lower buildup layers are completed.

(17) Upper and lower solder mask layers (170A, 170B) are formed on the upper and lower buildup layers (FIG. 18A). The upper and lower solder mask layers have the same openings (171A, 171B) as those of the first embodiment. The openings expose the pads.

(18) A metal film 172 formed of a nickel layer and a gold layer on the nickel layer is formed on the pad (FIG. 18B).

(19) Thereafter, a solder bump (176U) is formed on the pad of the upper buildup layer, and a solder bump (176D) is formed on the pad of the lower buildup layer. Printed wiring board 10 having the solder bump is completed (FIG. 11).

The bypass connection line (WU) described with reference to the printed wiring board of the second embodiment may be provided.

Third Embodiment

Figure 19:
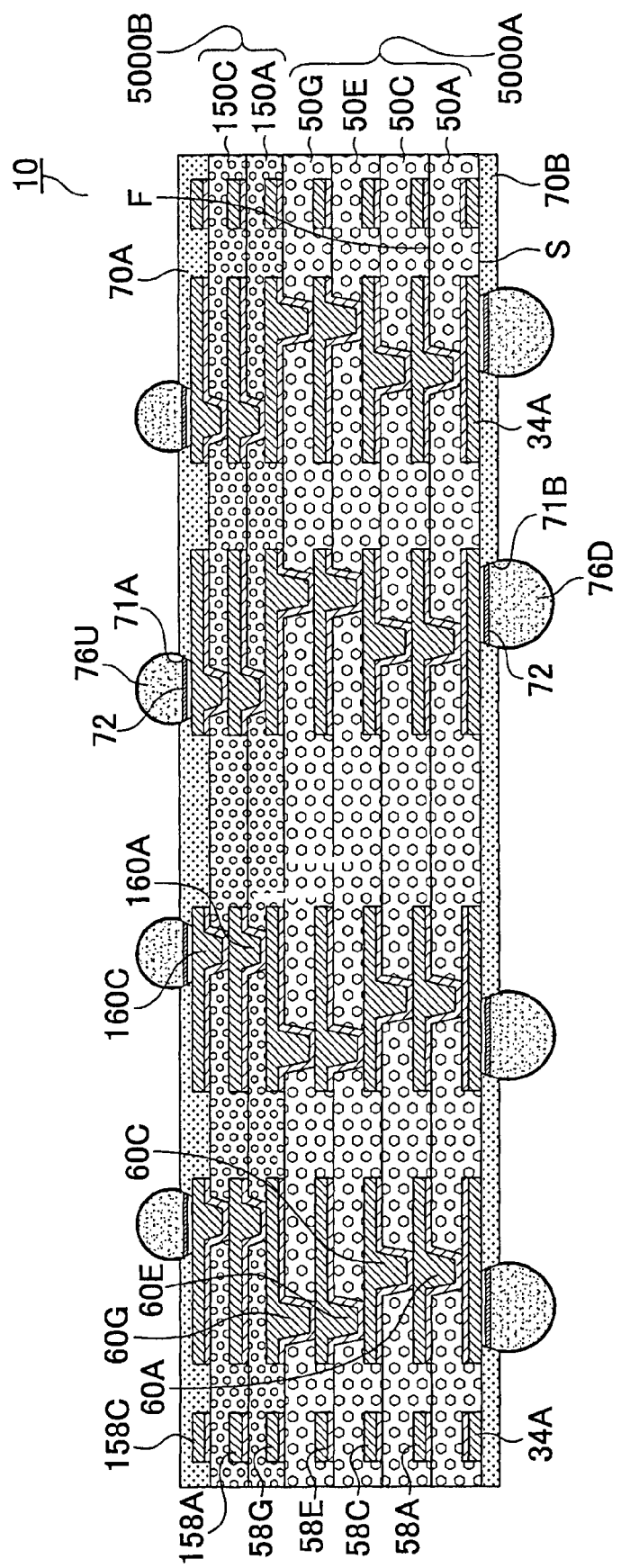
FIG. 19 is a cross-sectional view of a printed wiring board according to a third embodiment of the invention.

FIG. 19 illustrates a cross section of a printed wiring board 10 according to a third embodiment of the invention. The printed wiring board of the third embodiment has a first buildup layer (5000A) and a second buildup layer (5000B) on the first buildup layer. The first buildup layer has four interlayer resin insulating layers (50A, 50C, 50E, 50G) and the second buildup layer has two interlayer resin insulating layers (150A, 150C). The printed wiring board of the third embodiment is formed of the upper buildup layer of the first embodiment, conductive layer (34A) formed on the first surface of the core substrate, and upper and lower solder mask layers (70A, 70B). Interlayer resin insulating layer (lowermost interlayer resin insulating layer) (50A) has a first surface (F) and a second surface (S) opposite the first surface. Conductive layer (lowermost conductive layer) (34A) is embedded in the second-surface side of interlayer resin insulating layer (50A). Solder mask layer (70A) is formed on the second buildup layer, and solder mask layer (70B) is formed on the second surface of interlayer resin insulating layer (50A) and conductive layer (34A).

Conductive layer (34A) has a ground layer. Conductive layer (58A) has a high-speed signal line. Conductive layer (34A) and conductive layer (58A) are connected to a via conductor (60A) passing through fourth interlayer resin insulating layer (50A). Third interlayer resin insulating layer (50C) of the second layer is formed on the first surface of fourth interlayer resin insulating layer (50A) and conductive layer (58A). A conductive layer (58C) is formed on third interlayer resin insulating layer (50C). Conductive layer (58C) has a ground layer. Conductive layer (58C) and conductive layer (58A) are connected to a via conductor (60C) passing through third interlayer resin insulating layer (50C). Second interlayer resin insulating layer (50E) of the third layer is formed on third interlayer resin insulating layer (50C) and conductive layer (58C). A conductive layer (58E) is formed on second interlayer resin insulating layer (50E). Conductive layer (58E) includes a high-speed signal line. Conductive layer (58E) and conductive layer (58C) are connected to a via conductor (60E) passing through second interlayer resin insulating layer (50E). First interlayer resin insulating layer (50G) of the fourth layer is formed on second interlayer resin insulating layer (50E) and conductive layer (58E). Conductive layer (58G) is formed on first interlayer resin insulating layer (50G). Conductive layer (58G) includes a ground layer. Conductive layer (58G) and conductive layer (58E) are connected to a via conductor (60G) passing through first interlayer resin insulating layer (50G). The first buildup layer is completed. The high-speed signal line is interposed between the upper and lower ground layers.

Lower interlayer resin insulating layer (150A) of the second buildup layer is formed on first interlayer resin insulating layer (50G) of the first buildup layer. Conductive layer (158A) is formed on interlayer resin insulating layer (150A). Conductive layer (158A) and conductive layer (58G) are connected to a via conductor (160A) passing through interlayer resin insulating layer (150A). Interlayer resin insulating layer (uppermost interlayer resin insulating layer) (150C) of the second layer is formed on interlayer resin insulating layer (150A) and conductive layer (158A). A conductive layer (158C) is formed on interlayer resin insulating layer (150C). Conductive layer (158C) and conductive layer (158A) are connected to an uppermost via conductor (160C) passing through interlayer resin insulating layer (150C). The second buildup layer is completed.

A solder mask layer (70A) having an opening (71A) is formed on the second buildup layer. A solder mask layer (70B) having an opening (71B) is formed on the first buildup layer. Conductive layer (158C), conductive layer (34A) and the upper surface of via conductor (160C) exposed by the opening of the solder mask layer serve as pads. A metal film 72 such as Ni/Pd/Au is formed on the pad, and solder bumps (76U, 76D) are formed on the metal film. The IC chip is mounted on the printed wiring board through solder bump (76U) formed on the upper buildup layer. The printed wiring board is mounted on the main board through solder bump (76D) formed on the lower buildup layer. The printed wiring board of the third embodiment has the same first buildup layer and second buildup layer as those of the first embodiment. For this reason, the printed wiring board of the third embodiment has the same effect as that of the first embodiment. The printed wiring board of the third embodiment may have bypass connection line (WV) described in the first embodiment.

Figure 20:
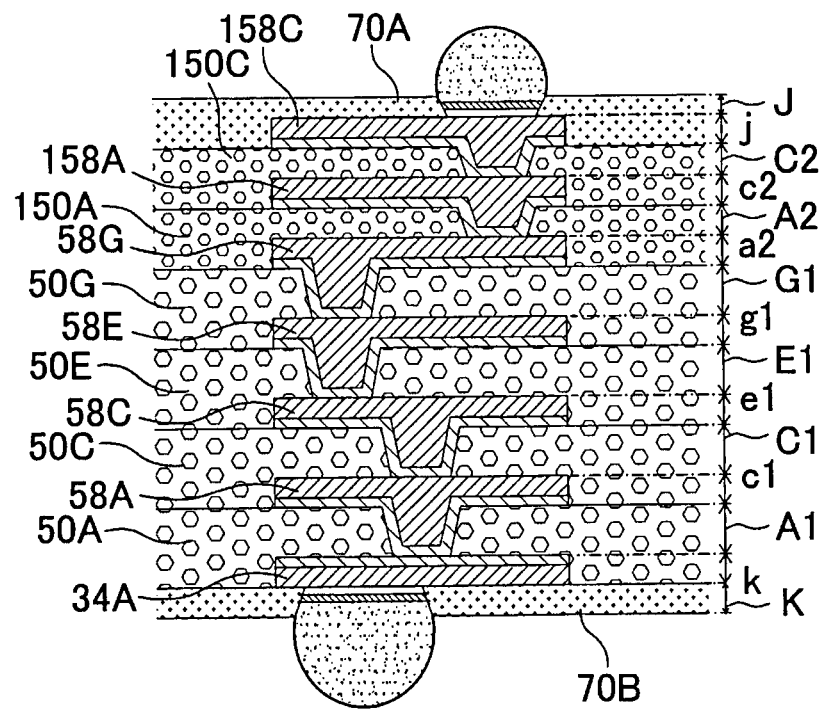
FIG. 20 is a cross-sectional view illustrating part of the printed wiring board of the third embodiment.

FIG. 20 illustrates part of the printed wiring board of FIG. 19.

The thickness of each of interlayer resin insulating layers (50A, 50C, 50E, 50G) of the first buildup layer is 60 μm. The thickness of each conductive layer of the first buildup layer is 35 μm.

The thickness of each of interlayer resin insulating layers (150A, 150C) of the second buildup layer is 20 μm. The thickness of each conductive layer of the second buildup layer is 15 μm.

Interlayer resin insulating layers (50A, 50C, 50E, 50G) each have a reinforcement member. The relative permittivity of the interlayer resin insulating layer of the first buildup layer is 3.9, and the dielectric tangent is 0.009. Interlayer resin insulating layers (150A, 150C) of the second buildup layer have no reinforcement member. The relative permittivity of the interlayer resin insulating layer of the second buildup layer is 3.1, and the dielectric tangent is 0.019. The relative permittivity of upper and lower solder mask layers (70A, 70B) is 3.55, and the dielectric tangent is 0.024.

According to one aspect of the invention, there is provided a printed wiring board including: a first buildup layer that is formed of a first interlayer resin insulating layer, a second interlayer resin insulating layer, a first signal line interposed between the first interlayer resin insulating layer and the second interlayer resin insulating layer, a first ground layer formed on the surface of the first interlayer resin insulating layer, and a second ground layer formed on the surface of the second interlayer resin insulating layer; and a second buildup layer that is formed on the first buildup layer, and has an uppermost interlayer resin insulating layer and an uppermost conductive layer formed on the uppermost interlayer resin insulating layer. The first signal line is interposed between the first ground layer and the second ground layer, and the interlayer resin insulating layer of the first buildup layer and the interlayer resin insulating layer of the second buildup layer differ from each other in material or thickness.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first buildup layer comprising a first interlayer resin insulating layer and a second interlayer resin insulating layer; and
a second buildup layer formed on the first buildup layer and comprising an outermost interlayer resin insulating layer and an outermost conductive layer formed on the outermost interlayer resin insulating layer,
wherein the first buildup layer includes a first signal line interposed between the first interlayer resin insulating layer and the second interlayer resin insulating layer, a first ground layer formed on a surface of the first interlayer resin insulating layer, and a second ground layer formed on a surface of the second interlayer resin insulating layer such that the first signal line is interposed between the first ground layer and the second ground layer, the first and second interlayer resin insulating layers in the first buildup layer and the outermost interlayer resin insulating layer in the second buildup layer comprise resin materials, respectively, such that each of the first and second interlayer resin insulating layers in the first buildup layer comprises a single material, and the first and second interlayer resin insulating layers in the first buildup layer are different in material, thickness or a combination thereof from the outermost interlayer resin insulating layer in the second buildup layer.

2. The printed wiring board according to claim 1, wherein the first buildup layer further includes a third interlayer resin insulating layer, a fourth interlayer resin insulating layer, a second signal line interposed between the third interlayer resin insulating layer and the fourth interlayer resin insulating layer, a third ground layer on a surface of the third interlayer resin insulating layer, and a fourth ground layer formed on a surface of the fourth interlayer resin insulating layer such that the second signal line is interposed between the third ground layer and the fourth ground layer, and the third and fourth interlayer resin insulating layers comprise resins, respectively.

3. The printed wiring board according to claim 1, wherein the first and second interlayer resin insulating layers of the first buildup layer have relative permittivities which is higher than a relative permittivity of the outermost interlayer resin insulating layer of the second buildup layer and which is in a range of 3.9 or lower.

4. The printed wiring board according to claim 1, wherein the first and second interlayer resin insulating layers of the first buildup layer have thicknesses which are greater than a thickness of the outermost interlayer resin insulating layer of the second buildup layer and which are 30 µm or greater.

5. The printed wiring board according to claim 3, wherein the first and second interlayer resin insulating layers of the first buildup layer have dielectric tangents which are lower than a dielectric tangent of the outermost interlayer resin insulating layer of the second buildup layer.

6. The printed wiring board according to claim 1, wherein the first buildup layer has a plurality of interlayer resin insulating layers including the first and second interlayer resin insulating layers in an even number.

7. The printed wiring board according to claim 2, wherein the first buildup layer has four interlayer resin insulating layers including the first and second interlayer resin insulating layers.

8. The printed wiring board according to claim 1, wherein the first buildup layer further includes a third signal line interposed between the first interlayer resin insulating layer and the second interlayer resin insulating layer, the first signal line has a width which is at least as wide as a width of the third signal line, and the first signal line is configured to transmit a signal at a speed which is higher than a speed of a signal transmitted through the third signal line.

9. The printed wiring board according to claim 1, wherein the outermost interlayer resin insulating layer is formed directly on the first interlayer resin insulating layer and the first ground layer, the first buildup layer has a first via conductor passing through the first interlayer resin insulating layer and is connected to the first signal line, the second buildup layer has an outermost via conductor passing through the outermost interlayer resin insulating layer and is electrically connected to the first signal line, and the outermost via conductor is not formed immediately above the first via conductor.

10. The printed wiring board according to claim 9, wherein the first via conductor has a land portion, and the outermost via conductor is formed on the land portion of the first via conductor.

11. The printed wiring board according to claim 9, wherein the outermost via conductor and the first via conductor are separated by a distance which is 75 µm or less.

12. The printed wiring board according to claim 1, wherein the outermost interlayer resin insulating layer of the second buildup layer has no reinforcement member, and the first and second interlayer resin insulating layers of the first buildup layer have reinforcement members, respectively.

13. The printed wiring board according to claim 1, wherein the first signal line has a thickness which is at least as thick as a thickness of the outermost conductive layer.

14. The printed wiring board according to claim 13, wherein the first signal line has a thickness which is greater than a thickness of the outermost conductive layer.

15. The printed wiring board according to claim 1, wherein the first and second interlayer resin insulating layers of the first buildup layer have thicknesses which are greater than a thickness of the outermost interlayer resin insulating layer of the second buildup layer.

16. The printed wiring board according to claim 9, further comprising a bypass connection line formed between the outermost via conductor and the first via conductor.

17. The printed wiring board according to claim 1, further comprising:
 a bump positioned to connect to a main board;
 a BGA pad positioned to mount the bump; and
 a bypass connection line formed between the BGA pad and the first signal line.

18. The printed wiring board according to claim 2, further comprising:
 a bump positioned to connect to a main board;
 a BGA pad positioned to mount the bump; and
 a bypass connection line formed between the BGA pad and the first signal line.

19. The printed wiring board according to claim 1, wherein the first buildup layer comprises a plurality of interlayer resin insulating layers including the first interlayer resin insulating layer and the second interlayer resin insulating layer, the second buildup layer comprises a plurality of interlayer resin insulating layers including the outermost interlayer resin insulating layer, each of the interlayer resin insulating layers in the first buildup layer comprises a single material, and the plurality of interlayer resin insulating layers in the first buildup layer is different in material, thickness or a combination thereof from the plurality of interlayer resin insulating layers in the second buildup layer.

20. The printed wiring board according to claim 1, wherein the first buildup layer comprises a plurality of interlayer resin insulating layers including the first interlayer resin insulating layer and the second interlayer resin insulating layer, the second buildup layer comprises a plurality of interlayer resin insulating layers including the outermost interlayer resin insulating layer, and each of the interlayer resin insulating layers in the first buildup layer comprises a single material.

* * * * *